United States Patent
Nishimura

(10) Patent No.: US 10,347,550 B2
(45) Date of Patent: Jul. 9, 2019

(54) SEMICONDUCTOR PACKAGE AND METHOD OF MAKING THE SAME

(71) Applicant: ROHM CO., LTD., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/686,930

(22) Filed: Aug. 25, 2017

(65) Prior Publication Data

US 2018/0076106 A1    Mar. 15, 2018

(30) Foreign Application Priority Data

Sep. 15, 2016  (JP) ................. 2016-180294

(51) Int. Cl.
| | |
|---|---|
| *H01L 23/13* | (2006.01) |
| *H01L 21/48* | (2006.01) |
| *H01L 23/14* | (2006.01) |
| *H01L 23/373* | (2006.01) |
| *H01L 23/498* | (2006.01) |
| *H01L 23/00* | (2006.01) |

(Continued)

(52) U.S. Cl.
CPC .......... *H01L 23/13* (2013.01); *H01L 21/4803* (2013.01); *H01L 21/486* (2013.01); *H01L 21/4853* (2013.01); *H01L 23/145* (2013.01); *H01L 23/3733* (2013.01); *H01L 23/49827* (2013.01); *H01L 24/16* (2013.01); *H01L 43/04* (2013.01); *H01L 43/065* (2013.01); *H01L 2224/16227* (2013.01); *H01L 2224/16235* (2013.01); *H01L 2924/19042* (2013.01); *H01L 2924/19101* (2013.01)

(58) Field of Classification Search
CPC ...................................................... H01L 23/13
USPC .......................................... 257/421; 438/149
See application file for complete search history.

(56) References Cited

U.S. PATENT DOCUMENTS

| | | | |
|---|---|---|---|
| 2003/0155639 A1* | 8/2003 | Nakamura ............ | H01L 25/167 257/680 |
| 2011/0089551 A1* | 4/2011 | Ishihara .................. | H01L 23/13 257/685 |

(Continued)

FOREIGN PATENT DOCUMENTS

JP    2005277380 A    10/2005

*Primary Examiner* — Jami Valentine Miller
(74) *Attorney, Agent, or Firm* — Hamre, Schumann, Mueller & Larson, P.C.

(57) ABSTRACT

The present disclosure provides a semiconductor device and a method of making the same for suppressing warpages of an article due to a difference of temperature strains during the process of making the semiconductor device. The semiconductor device of the present disclosure includes a substrate having a main surface and a recess recessed therefrom; a semiconductor element disposed in the recess; a wiring portion connected to the substrate and electrically connected to the semiconductor element; and a sealing resin filled in the recess. The substrate includes an electrical insulative synthetic resin. The recess has a bottom surface and a connecting surface connected to the bottom surface and the main surface. The connecting surface includes a first inclined surface connected to the bottom surface; a second inclined surface connected to the main surface; and an intermediate surface connected to the first inclined surface and the second inclined surface.

22 Claims, 23 Drawing Sheets

(51) Int. Cl.
*H01L 43/04* (2006.01)
*H01L 43/06* (2006.01)

(56) References Cited

U.S. PATENT DOCUMENTS

| | | | | |
|---|---|---|---|---|
| 2011/0098398 | A1* | 4/2011 | Yuan | C08K 3/34 |
| | | | | 524/493 |
| 2013/0169149 | A1* | 7/2013 | Sato | H01L 33/502 |
| | | | | 313/512 |
| 2014/0175663 | A1* | 6/2014 | Chen | H01L 24/29 |
| | | | | 257/774 |
| 2014/0284731 | A1* | 9/2014 | Nakao | H01L 23/49579 |
| | | | | 257/415 |
| 2016/0027756 | A1* | 1/2016 | Takeda | H01L 23/13 |
| | | | | 257/737 |
| 2017/0053903 | A1* | 2/2017 | Nishimura | H01L 25/167 |

\* cited by examiner

SEMICONDUCTOR PACKAGE AND METHOD OF MAKING THE SAME

TECHNICAL FIELD

The present invention relates to a semiconductor device including a semiconductor element mounted on a substrate having a synthetic resin and finely machined, and a method of making the same.

BACKGROUND

In recent years, a so-called micro-machine (MEMS: Micro Electro Mechanical Systems) having various semiconductor elements mounted on a micro-machined Si substrate (silicon wafer) has been developed by using LSI (Large Scale Integration) manufacturing technology, and has become increasingly popular. When manufacturing such a micro-machine, anisotropic etching using an alkaline solution is applied as a microfabrication method of a Si substrate. A small recess with a semiconductor element disposed therein can be formed on the Si substrate by anisotropic etching with good accuracy.

For example, in Patent Literature 1, an LED (light emitting diode) package based on the above mentioned manufacturing technology of the micro-machine is disclosed. The LED package is that a recess (concave portion) with a bottom surface and a lateral surface is formed in a Si substrate, and an LED chip is mounted on the bottom surface of the recess. The recess is formed from the (100) plane of the Si substrate by anisotropic etching. Therefore, the lateral surface of the recess is inclined with respect to the bottom surface of the recess, and includes (111) plane. Further, on the bottom surface and the lateral surface of the recess, an electrode (wiring portion) is formed and electrically connected to the LED chip. A Ti layer and a Cu layer coated on the Si substrate by sputtering are patterned by photolithography and etching to form the electrode, wherein the Si substrate includes the recess. After the electrode is formed, the LED chip is mounted on the bottom surface of the recess, and resin mold (sealing resin) is formed to be filled in the recess, thereby fabricating the LED package.

Herein, during forming the resin mold of the LED package, if the Si substrate is heated for curing the resin mold, temperature strain occurs at both the Si substrate and the resin mold. At this time, the thermal expansion coefficient of the epoxy resin constituting the resin mold is higher than the thermal expansion coefficient of Si constituting the Si substrate, such that the temperature strain occurring on the resin mold is larger than the temperature strain occurring at the Si substrate. Therefore, a warpage occurs at the package due to the difference of the temperature strain between the Si substrate and the resin mold, and there is a risk that the package is poor due to the warpage.

PATENT LITERATURES

[Patent Literature 1] Japanese Patent Application Laid-Open No. 2005-277380

BRIEF SUMMARY OF THE INVENTION

Problems to be Solved

An object of the present invention is to provide a semiconductor device and a method of making the same, which can suppress a warpage of an article due to the difference of temperature strains.

Technical Means for Solving Problems

A semiconductor device according to a first aspect of the present invention includes a semiconductor element; a substrate having a main surface and a back surface facing opposite sides in a thickness direction, and having a recess recessed from the main surface and having the semiconductor element disposed therein; a wiring portion in contact with the substrate and electrically connected to the semiconductor element; and a sealing resin covering the semiconductor element and filled in the recess; wherein the substrate comprises an electrical insulative synthetic resin, the semiconductor element is disposed on a bottom surface of the recess, and a connecting surface connected to the bottom surface and the main surface, and the connecting surface includes a first inclined surface having one end connected to the bottom surface and inclined with respect to the bottom surface, a second inclined surface having one end connected to the main surface and inclined with respect to the main surface, and an intermediate surface connected to another end of the first inclined surface and another end of the second inclined surface.

In the implementation of the present invention, it is preferred that the synthetic resin is an epoxy resin containing a filler.

In the implementation of the present invention, it is preferred that the filler includes SiO2.

In the implementation of the present invention, it is preferred that the bottom surface of the recess in a top view is rectangular.

In the implementation of the present invention, it is preferred that the connecting surface of the recess includes a pair of surfaces spaced apart from each other along a first direction perpendicular to the thickness direction of the substrate, the recess has a pair of openings spaced apart from each other along a second direction perpendicular to both the thickness direction of the substrate and the first direction, and the sealing resin is exposed from each of the openings.

In the implementation of the present invention, it is preferred that the wiring portion includes a base layer and a plating layer laminated to each other, and the base layer is in contact with the substrate.

In the implementation of the present invention, it is preferred that a thickness of the plating layer is larger than a thickness of the base layer.

In the implementation of the present invention, it is preferred that the base layer includes a Ti layer and a Cu layer laminated to each other.

In the implementation of the present invention, it is preferred that the plating layer comprises Cu.

In the implementation of the present invention, it is preferred that the wiring portion includes a bottom surface wiring portion in contact with the bottom surface of the recess, and a connecting surface wiring portion in contact with the connecting surface of the recess, and the semiconductor element is connected to the bottom surface wiring portion.

In the implementation of the present invention, it is preferred that a terminal portion is included as an external electrical connection for the wiring portion, wherein the terminal portion has a pillar with one end in contact with the wiring portion and a pad in contact with the other end of the pillar.

In the implementation of the present invention, it is preferred that the pillar includes Cu.

In the implementation of the present invention, it is preferred that the pad includes a Ni layer, a Pd layer and an Au layer laminated to each other.

In the implementation of the present invention, it is preferred that the pillar is formed inside the substrate and exposed from the bottom surface of the recess and the back surface, one end of the pillar exposed from the bottom surface is in contact with the bottom surface wiring portion, and the other end of the pillar exposed from the back surface is in contact with the pad.

In the implementation of the present invention, it is preferred that an inductor is mounted on the intermediate surface of the connecting surface of the recess.

In the implementation of the present invention, it is preferred that the wiring portion includes a main surface wiring portion in contact with the main surface, one end of the pillar is in contact with the main surface wiring portion, the other end of the pillar is in contact with the pad, and a side surface of the pillar is covered by the sealing resin.

In the implementation of the present invention, it is preferred that the semiconductor element is a Hall element.

In the implementation of the present invention, it is preferred that a bonding layer is interposed between the semiconductor element and the bottom surface wiring portion.

In the implementation of the present invention, it is preferred that the bonding layer includes a Ni layer and an alloy layer containing Sn, and the Ni layer and the alloy layer are laminated to each other.

In the implementation of the present invention, it is preferred that the sealing resin includes the same material as the substrate.

A method of making a semiconductor device according to a second aspect of the present invention includes: a step of forming a base material having a main surface and a groove portion, recessed from the main surface and having a bottom surface, with a mold; a step of forming a conductive layer in contact with the base material including the groove portion; a step of mounting a semiconductor element on the bottom surface of the groove portion so as to be accommodated in the groove portion; and a step of forming a sealing resin covering the semiconductor element and filled in the groove portion; wherein the base material includes an electrical insulative synthetic resin; the groove portion has a pair of connecting surfaces connected to the main surface and the bottom surface; each of the connecting surface includes a first inclined surface having one end connected to the bottom surface and inclined with respect to the bottom surface, a second inclined surface having one end connected to the main surface and inclined with respect to the main surface, and an intermediate surface connected to another end of the first inclined surface and another end of the second inclined surface; and in the step of forming the base material, the mold serves as a core, and the first inclined surface, the second inclined surface, and the intermediate surface are formed.

In the implementation of the present invention, it is preferred that the mold comprises an oxide film of a single crystal intrinsic semiconductor material In the implementation of the present invention, it is preferred that the oxide film is $SiO_2$.

In the implementation of the present invention, it is preferred that the mold is formed by isotropic etching.

In the implementation of the present invention, it is preferred that the step of forming the conductive layer includes a step of forming a base layer in contact with the base material by sputtering, a step of forming a mask for forming a plating layer by photolithography on the base layer, and a step of forming the plating layer in contact with the base layer by electrolytic plating.

In the implementation of the present invention, it is preferred that the step of forming the base material includes forming a hole, recessed from the bottom surface of the groove portion and not penetrating the base material, by the mold; and the step of forming the conductive layer includes a step of forming a conductive pillar filled in the hole.

In the implementation of the present invention, it is preferred that after the step of forming the sealing resin, a portion of the base material on a side opposite to the main surface is removed to expose a portion of the conductive pillar from the base material.

In the implementation of the present invention, it is preferred that the step of forming the conductive layer includes a step of forming a conductive pillar in contact with the conductive layer in contact with the main surface, and the conductive pillar protrudes to a side opposite to the bottom surface with respect to the main surface.

In the implementation of the present invention, it is preferred that the step of forming the conductive pillar includes electrolytic plating.

In the implementation of the present invention, it is preferred that after the step of forming the sealing resin, a pad is formed to be in contact with the portion of the conductive pillar exposed from the base material by electroless plating.

In the implementation of the present invention, it is preferred that the step of forming the conductive layer includes a step of forming a bonding layer in contact with the conductive layer in contact with the groove portion by electrolytic plating.

Effects of the Present Invention

The semiconductor device of the present invention includes a substrate, and the substrate includes an electrical insulative synthetic resin and has a recess recessed from the main surface and having the semiconductor element disposed therein. The recess has a bottom surface having the semiconductor element disposed thereon, and a connecting surface connected to the bottom surface and the main surface. The connecting surface includes a first inclined surface and a second inclined surface, both being inclined surfaces, and an intermediate surface connected to the two inclined surfaces. By using this configuration, the thermal expansion coefficient of the substrate becomes close to the thermal expansion coefficient of the sealing resin, such that the distribution of the temperature strain in the thickness direction of the semiconductor device becomes substantially the same. Further, in the first direction, the substrate and the sealing resin are engaged with each other, and thus in the process of making the semiconductor device, the base material and the sealing resin are integrated into one and have uniform thermal expansion, such that the difference between the temperature strains of the base material and the sealing resin is minor. Therefore, during the process of making the semiconductor device, warpages due to the difference of temperature strains are suppressed.

Other features and advantages of the present invention will become more apparent from the following detailed description with the accompanying drawings.

DETAILED DESCRIPTION

Figure 1:
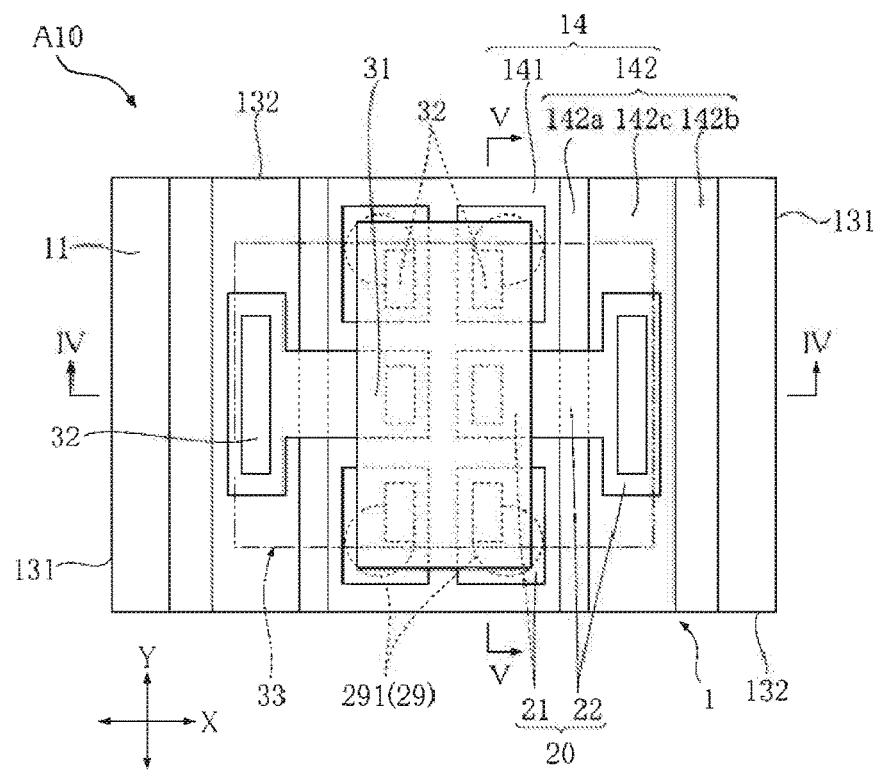
FIG. 1 is a top view (through a sealing resin) showing a semiconductor device according to a first embodiment of the present invention.

The implementation of the present invention (hereinafter referred to as "embodiments") will be described with reference to the accompanying drawings.

First Embodiment

The semiconductor device A10 according to the first embodiment of the present invention is described with reference to FIG. 1 to FIG. 5. The semiconductor device A10 includes a substrate 1, a wiring portion 20, a terminal portion 29, a semiconductor element 31, a bonding layer 32, an inductor 33 and a sealing resin 4.

Figure 2:
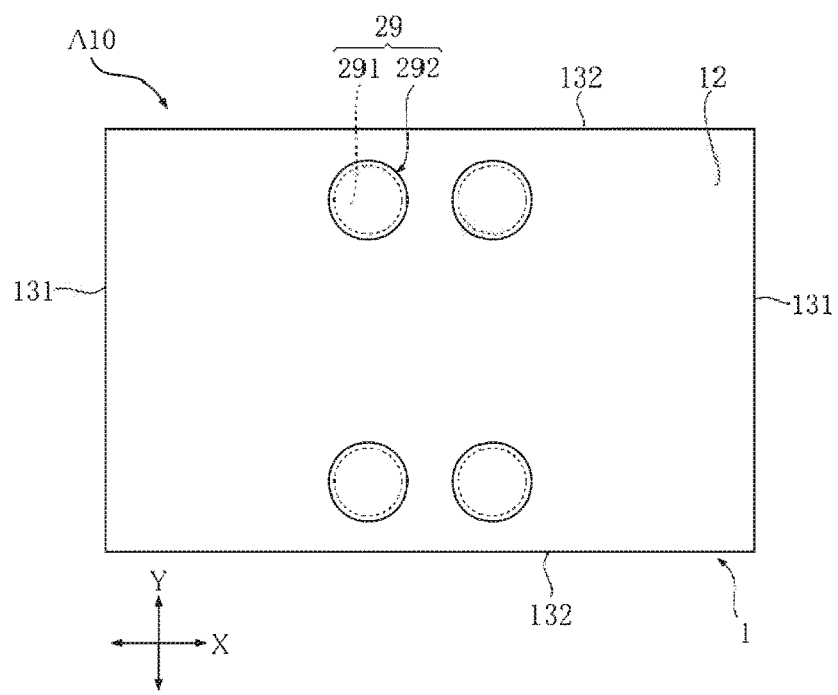
FIG. 2 is a bottom view of the semiconductor device of FIG. 1.
Figure 3:
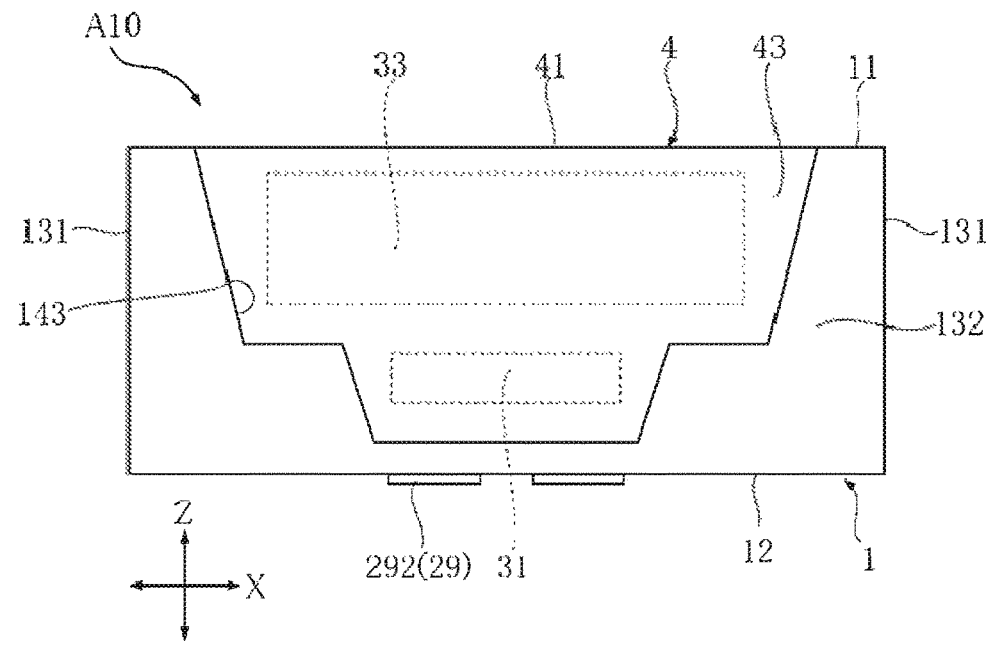
FIG. 3 is a right side view of the semiconductor device of FIG. 1.
Figure 4:
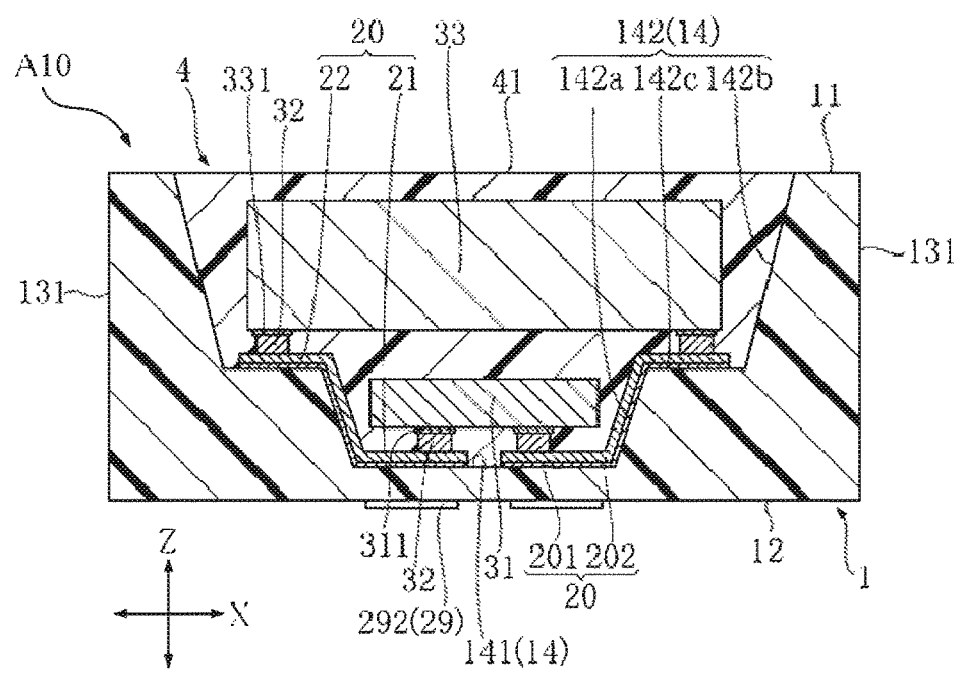
FIG. 4 is a cross-sectional view taken along line IV-IV of FIG. 1.
Figure 5:
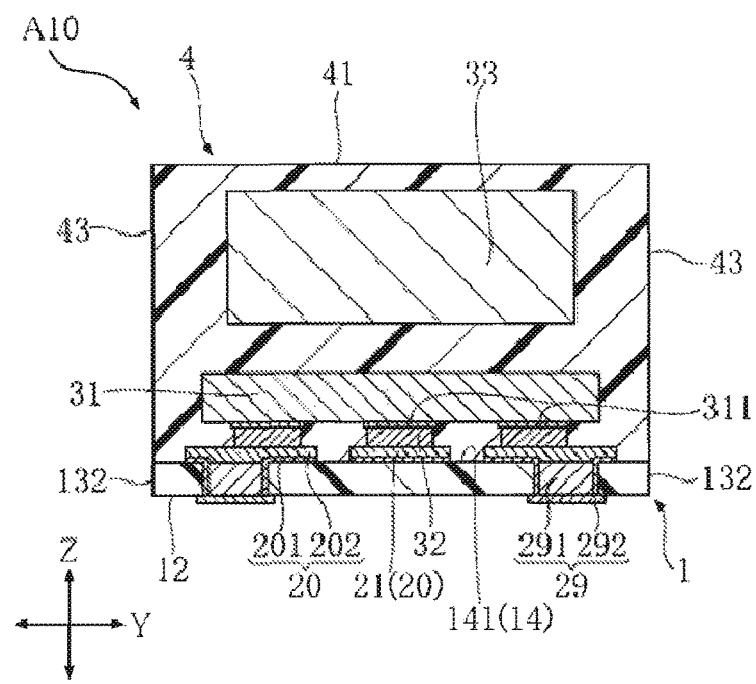
FIG. 5 is a cross-sectional view taken along line V-V of FIG. 1.

FIG. 1 is a top view of the semiconductor device A10 through the sealing resin 4 for ease of understanding. Further, in FIG. 1, for ease of understanding, the inductor 33 is represented by an imaginary line (two dots-and-dash line). FIG. 2 is a bottom view of the semiconductor device A10. FIG. 3 is a right side view of the semiconductor device A10. FIG. 4 is a cross-sectional view taken along line IV-IV of FIG. 1. FIG. 5 is a cross-sectional view taken along line V-V of FIG. 1.

The semiconductor device A10 shown in these figures is, for example, a device mounted on a circuit substrate of a module of a DC-DC (Direct Current-Direct Current) converter. As shown in FIG. 1, the shape of the substrate 1 of the semiconductor device A10 in the thickness direction Z (hereinafter referred to as "in a top view") is rectangular. Herein, in order to facilitate the description, the long side direction (the left and right direction of the top view) of the semiconductor device A10 perpendicular to the thickness direction Z of the substrate 1 is referred to as the first direction X. Also, the short side direction (the up and down direction) of the semiconductor device A10 perpendicular to the thickness direction Z of the substrate 1 and the first direction X is referred to as the second direction Y.

As shown in FIG. 1 to FIG. 5, the substrate 1 is used for accommodating the semiconductor element 31 and mounting the semiconductor device A10 on the circuit substrate. The substrate 1 includes an electrical insulative black synthetic resin. In the present embodiment, the synthetic resin includes epoxy resin containing a filler. The filler includes $SiO_2$, and the content of the filler relative to the epoxy resin is 80 to 90%. The shape of the substrate 1 in a top view is a rectangular shape having a long side in the first direction X. The substrate 1 has a main surface 11, a back surface 12, a first side surface 131, a second side surface 132 and a recess 14.

As shown in FIG. 1 to FIG. 3, the main surface 11 and the back surface 12 face opposite sides in the thickness direction Z of the substrate 1. Further, the main surface 11 and the back surface 12 are flat surfaces perpendicular to the thickness direction Z of the substrate 1. The main surface 11 is an upper surface of the substrate 1 shown in FIG. 3, and includes a pair of surfaces spaced apart from each other along the first direction. The shape of each main surface 11 is a rectangular shape. In the substrate 1 in a top view, a recess 14 is disposed between a pair of main surfaces 11. Further, the sealing resin 4 filled in the recess 14 is exposed from the main surface 11. The back surface 12 is a lower surface of the substrate 1 shown in FIG. 3. A terminal portion 29 exposed from the back surface 12 is used for mounting the semiconductor device A10 on the circuit substrate. The shape of the back surface 12 is a rectangular shape.

As shown in FIG. 1 to FIG. 3, the first side surface 131 includes a pair of surfaces, which are disposed between the main surface 11 and the back surface 12, perpendicular to the main surface 11 and the back surface 12, and spaced apart from each other along the first direction X. Each of the first side surfaces 131 is rectangular, and is a flat surface. Further, as shown in FIG. 1 to FIG. 3, the second side surface 132 includes a pair of surfaces, which are disposed between the main surface 11 and the back surface 12, perpendicular to the main surface 11 and the back surface 12, and spaced apart from each other along the second direction Y. Each of the second side surfaces 132 is a flat surface. Two ends of each second side surface 132 in the first direction X are connected to the pair of the first side surfaces 131.

As shown in FIG. 1 and FIG. 3 to FIG. 5, the recess 14 is formed in a part of the substrate 1, recessed from the main surface 11, and is configured for having the semiconductor element 31 disposed therein. The shape of the recess 14 in a top view is a rectangular shape. In the present embodiment, the wiring portion 20 is formed to be in contact with the recess 14. The recess 14 has a bottom surface 141, a connecting surface 142 and a pair of openings 143.

As shown in FIG. 1, FIG. 4 and FIG. 5, the bottom surface 141 is a flat surface, which is disposed between the main surface 11 and the back surface 12, perpendicular to the thickness direction Z of the substrate 1, and the semiconductor element 31 is disposed thereon. The shape of the bottom surface 141 in a top view is a rectangular shape. Further, the wiring portion 20 is formed to be in contact with the bottom surface 141.

As shown in FIG. 1 and FIG. 4, the connecting surface 142 is connected to the bottom surface 141 and the main surface 11. In the present embodiment, the connecting surface 142 includes a pair of surfaces spaced apart from each other along the first direction X. Each connecting surface 142 includes a first inclined surface 142a, a second inclined surface 142b and an intermediate surface 142c. The first inclined surface 142a is a flat surface having one end connected to the bottom surface 141 and inclined with respect to the bottom surface 141. The second inclined surface 142b is a flat surface having one end connected to the main surface 11 and inclined with respect to the main surface 11. The intermediate surface 142c is a flat surface connected to another end of the first inclined surface 142a and another end of the second inclined surface 142b. The intermediate surface 142c is disposed between the first inclined surface 142a and the second inclined surface 142b in the thickness direction Z of the substrate 1, and perpendicular to the thickness direction Z of the substrate 1. In the present embodiment, the wiring portion 20 is formed to be in contact with the first inclined surface 142a and the intermediate surface 142c, and an inductor 33 is mounted on the intermediate surface 142c.

As shown in FIG. 3, a pair of openings 143 are spaced apart from each other along the second direction Y. Each opening 143 is formed along the second side surface 132. In the present embodiment, the sealing resin 4 is exposed from each opening 143.

As shown in FIG. 1, FIG. 4 and FIG. 5, the wiring portion 20 is formed to be in contact with the substrate 1, and is a conductor electrically connected to the semiconductor element 31. In the present embodiment, the wiring portion 20 is also electrically connected to the inductor 33. Therefore, the wiring portion 20 is formed as a conductive pathway among the semiconductor element 31, the inductor 33 and the circuit substrate on which the semiconductor device A10 is mounted. The wiring portion 20 includes a base layer 201 and a plating layer 202 laminated to each other. The base layer 201 is in contact with the substrate 1. In the present embodiment, a thickness of the base layer 201 is 200-300 nm, and a thickness of the plating layer 202 is 3-10 μm. Hence, the thickness of the plating layer 202 is set to be more than the thickness of the base layer 201. The base layer 201 includes a Ti layer and Cu layer laminated to each other. Further, the plating layer 202 includes Cu. In the present embodiment, the wiring portion 20 includes a bottom surface wiring portion 21 and a connecting surface wiring portion 22.

As shown in FIG. 1, FIG. 4 and FIG. 5, the bottom surface wiring portion 21 is in contact with the bottom surface 141 of the recess 14, so as to form a part of the wiring portion 20. The semiconductor element 31 is connected to the bottom surface wiring portion 21. Further, as shown in FIG. 1 and FIG. 4, the connecting surface wiring portion 22 is in contact with the connecting surface 142 of the recess 14 so as to form a part of the wiring portion 20. In the present embodiment, the connecting surface wiring portion 22 is formed to be in contact with the first inclined surface 142a and the intermediate surface 142c of the connecting surface 142. The inductor 33 is connected to the connecting surface wiring portion 22. Further, the connecting surface wiring portion 22 is in contact with a part of the bottom surface wiring portion 21.

The terminal portion 29 is a conductor configured for electrically connecting the wiring portion 20 to an external circuit substrate. The terminal portion 29 and the wiring portion 20 together constitute a conductive pathway among the semiconductor element 31, the inductor 33 and the circuit substrate on which the semiconductor device A10 is mounted. The terminal portion 29 has a pillar 291 and a pad 292.

As shown in FIG. 1, FIG. 2 and FIG. 5, the pillar 291 is a conductor having one end in contact with the wiring portion 20. The pillar 291 includes Cu. In the present embodiment, the pillar 291 is formed inside the substrate 1 and exposed from the bottom surface 141 of the recess 14 and the back surface 12. One end of the pillar 291 exposed from the bottom surface 141 is in contact with the bottom surface wiring portion 21. Further, the other end of the pillar 291 exposed from the back surface 12 is in contact with the pad 292. Therefore, in the present embodiment, the pillar 291 is disposed between the bottom surface wiring portion 21 and the pad 292. Further, the shape of the pillar 291 is a cylindrical shape.

As shown in FIG. 2 and FIG. 5, the pad 292 is a conductor in contact with another end of the pillar 291. The pad 292 includes a Ni layer, a Pd layer and an Au layer laminated to each other. In the present embodiment, the pad 292 covers the pillar 291 exposed from the back surface 12, and is thus viewable from the outside.

Further, the configuration of the wiring portion 20 and the terminal portion 29 shown in FIG. 1, FIG. 2, FIG. 4 and FIG. 5 is an example, and the actual configuration of the wiring portion 20 and the terminal portion 29 of the semiconductor device A10 is not limited to the above example.

As shown in FIG. 1, FIG. 4 and FIG. 5, the semiconductor element 31 is connected to the bottom surface wiring portion 21 through a bonding layer 32, so as to be mounted on the bottom surface 141 of the recess 14. In the present embodiment, the semiconductor element 31 is, for example, an integrated circuit (IC), which is a circuit of a gate driver or the like for driving MOSFET (metal oxide semiconductor field effect transistor). Further, in the present embodiment, the semiconductor element 31 is a so-called flip chip element. An electrode bump 311 is formed at the lower end of the semiconductor element 31 shown in FIG. 4. The electrode bump 311 includes Al, for example. The electrode bump 331 is in contact with the bonding layer 32, which is in contact with the bottom surface wiring portion 21.

As shown in FIG. 4 and FIG. 5, the bonding layer 32 is a conductor interposed between the electrode bump 311 of the semiconductor element 31 and the bottom surface wiring portion 21. The semiconductor element 31 is fixedly connected to the bottom surface wiring portion 21 by the bonding layer 32, and it is ensured that the semiconductor element 31 is electrically conducted to the bottom surface wiring portion 21. In the present embodiment, the bonding layer 32 includes a Ni layer and an alloy layer containing Sn laminated to each other. The alloy layer is, for example, a lead-free solder such as a Sn—Sb alloy or a Sn—Ag alloy. Further, in the present embodiment, the bonding layer 32 is also interposed between the electrode bump 331 of the inductor 33 described below and the connecting surface wiring portion 22 connected with the intermediate surface 142c of the connecting surface 142.

As shown in FIG. 4, the inductor 33 is connected to the connecting surface wiring portion 22 by the bonding layer 32, thereby being mounted on the intermediate surface 142c of the connecting surface 142 of the recess 14. In the present embodiment, the inductor 33 is a flip-chip type choke coil. The electrode bump 331 is formed at the lower end of the inductor 33 shown in FIG. 4. The electrode bump 331 includes Al, for example. The electrode bump 331 is connected to the bonding layer 32 in contact with the connecting surface wiring portion 22.

As shown in FIG. 3 to FIG. 5, the sealing resin 4 covers the semiconductor element 31 and is filled in the recess 14. In the present embodiment, the sealing resin 4 covers the wiring portion 20 and the inductor 33 in addition to the semiconductor element 31. Further, the sealing resin 4 includes the same material as that of the substrate 1. Therefore, in the present embodiment, the sealing resin 4 has an electrical insulative black epoxy resin containing a filler having $SiO_2$. The sealing resin 4 has a resin main surface 41 and a resin side surface 43.

As shown in FIG. 3 to FIG. 5, the resin main surface 41 is a part of the surface of the sealing resin 4 exposed from the main surface 11 of the substrate 1. In the present embodiment, the resin main surface 41 is the same plane as the main surface 11. Further, as shown in FIG. 3, the resin side surface 43 is a part of the surface of the sealing resin 4 exposed from the opening 143 of the recess 14. In the present embodiment, the resin side surface 43 includes a pair of surfaces spaced apart from each other along the second direction Y, and each resin side surface 43 is the same plane as the second side surface 132 of the substrate 1.

Then, an example of a method of making the semiconductor device A10 will be described with reference to FIG. 6 to FIG. 23.

Figure 8:
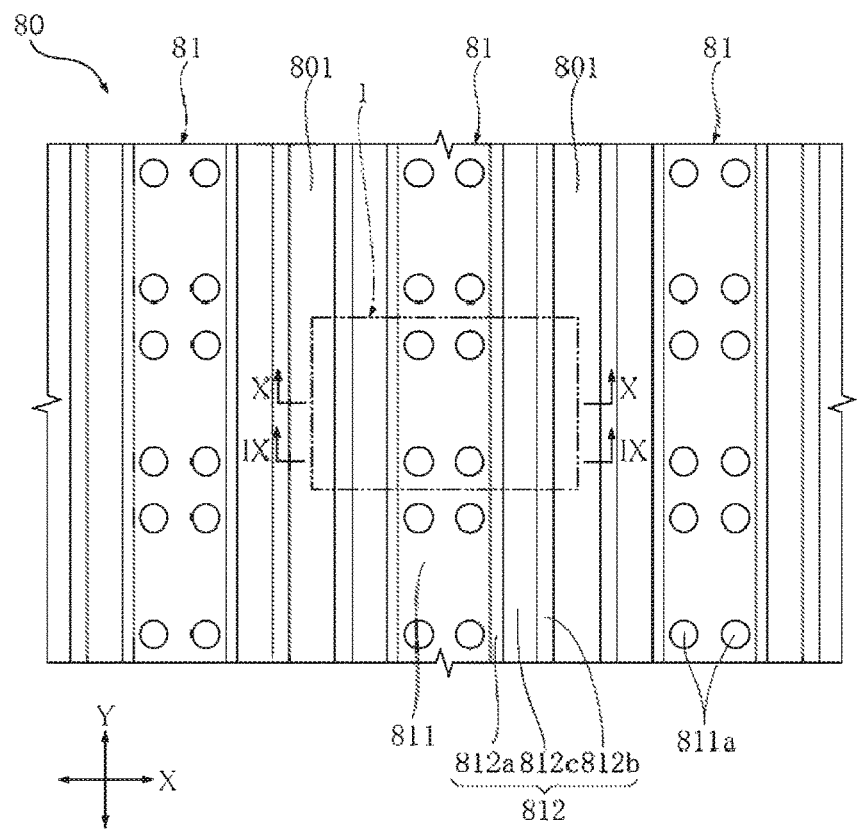
FIG. 8 is a top view illustrating a step of making the semiconductor device shown in FIG. 1.
Figure 9:
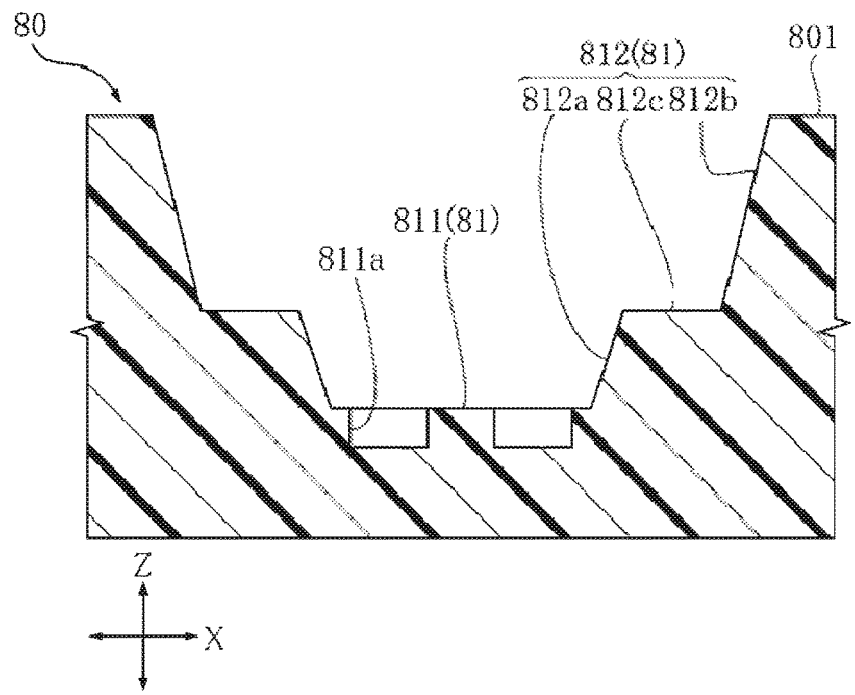
FIG. 9 is a cross-sectional view taken along line IX-IX of FIG. 8.
Figure 10:
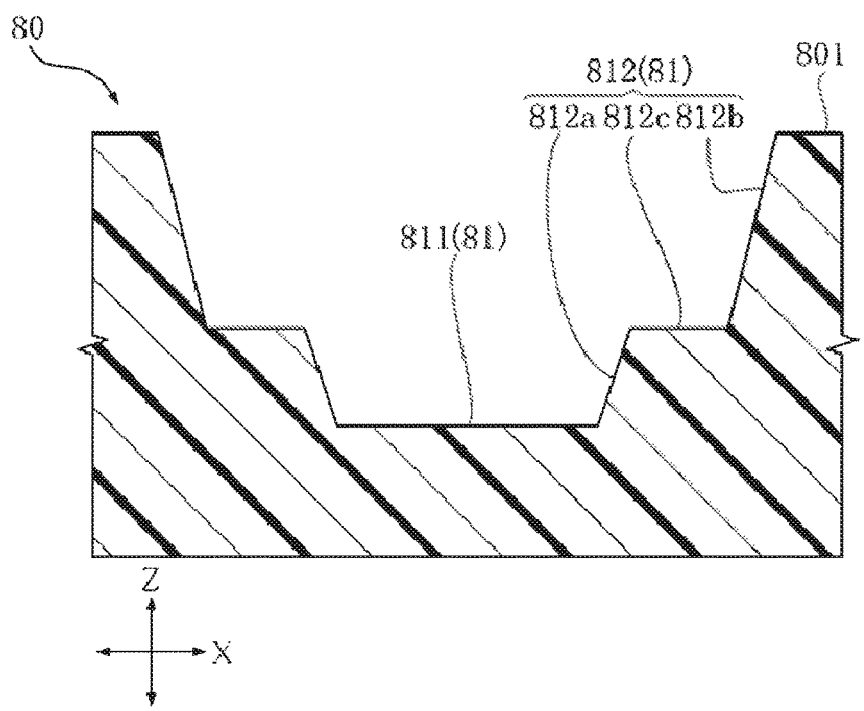
FIG. 10 is a cross-sectional view taken along line X-X of FIG. 8.

FIG. 6, FIG. 7 and FIG. 11 to FIG. 22 are cross-sectional views illustrating steps of making the semiconductor device A10. FIG. 8 and FIG. 23 are top views illustrating steps of making the semiconductor device A10. FIG. 9 is a cross-sectional view taken along line IX-IX of FIG. 8. FIG. 10 is a cross-sectional view taken along line X-X of FIG. 8. Herein, the cross-sectional positions of FIG. 6, FIG. 7, FIGS. 11-15, FIG. 21 and FIG. 22 are the same as that of FIG. 9. Further, the cross-sectional positions of FIG. 16 to FIG. 20 are the same as that of FIG. 10. Further, the thickness direction Z of the base material 80 to be described in the following, the first direction X and the second direction Y shown in FIG. 6 to FIG. 23 are the same as the thickness direction Z of the substrate 1, the first direction X and the second direction Y shown in FIG. 1 to FIG. 5.

Figure 6:
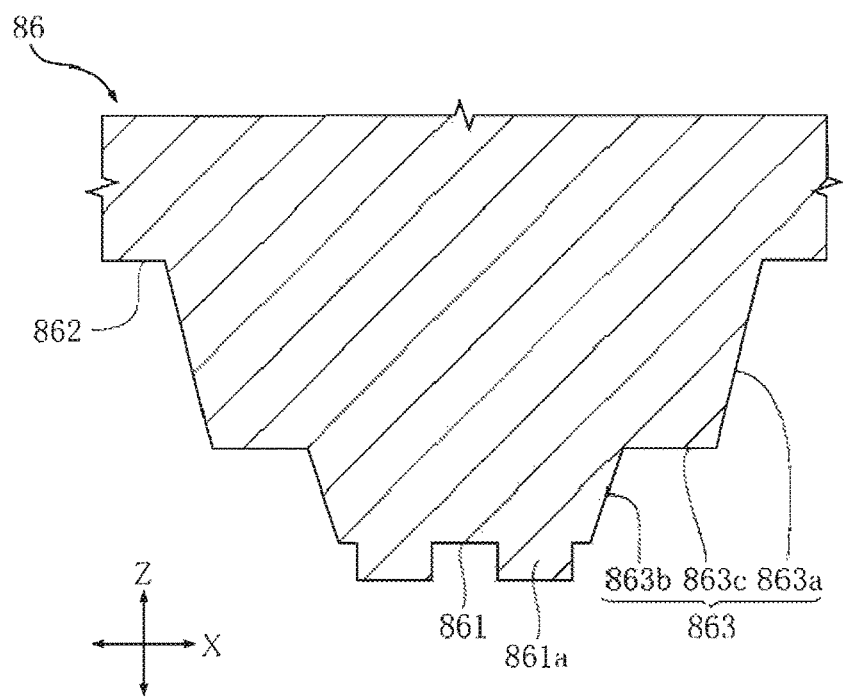
FIG. 6 is a cross-sectional view illustrating steps of making the semiconductor device shown in FIG. 1.

First, as shown in FIG. 6, a mold 86 is prepared. FIG. 6 is a cross-sectional view of the mold 86 with respect to the second direction Y. The mold 86 includes a top surface 861 and a base surface 862 facing the lower side of FIG. 6, and a connecting surface 863 connected to the top surface 861 and the base surface 862. The top surface 861 is disposed lower than the base surface 862 in FIG. 6. The connecting surface 863 includes a first inclined surface 863a, a second inclined surface 863b and an intermediate surface 863c. The first inclined surface 863a has one end connected to the base surface 862, and is inclined with respect to the base surface 862. The second inclined surface 863b has one end connected to the top surface 861, and is inclined with respect to the top surface 861. The intermediate surface 863c is connected to another end of the first inclined surface 863a and another end of the second inclined surface 863b. The intermediate surface 863c is disposed between the top surface 861 and the base surface 862, and faces the lower side of the FIG. 6. Further, in the present embodiment, the mold 86 is formed with a plurality of protrusions 861a protruding from the top surface 861 toward the lower side of FIG. 6. The shape of each protrusion 861a has a cylindrical shape (not shown) and is spaced apart from each other. The shape of the cross section of the mold 86 other than the protrusion 861a with respect to the second direction Y is uniform and crosses the second direction Y.

The mold 86 includes an oxide film of a single crystal intrinsic semiconductor material. In the present embodiment, the oxide film is $SiO_2$. For example, a surface of a silicon wafer is modified by thermal oxidation method to form an oxide film, which becomes the material of the mold 86. The mold 86 is formed by isotropic etching. In the present embodiment, the isotropic etching is, for example, a reactive ion etching as a representative example of dry etching. The mold 86 is formed according to the following sequence. First, the oxide film of $SiO_2$ formed on the silicon wafer is treated by photolithography to form a mask. Then, a part of the oxide film exposed from the mask is removed by reactive ion etching. At this time, for example, $CF_4$ is used as etching gas. Then, the mask formed on the oxide film is completely removed. The above sequence is repeatedly performed to form the mold 86.

Figure 7:
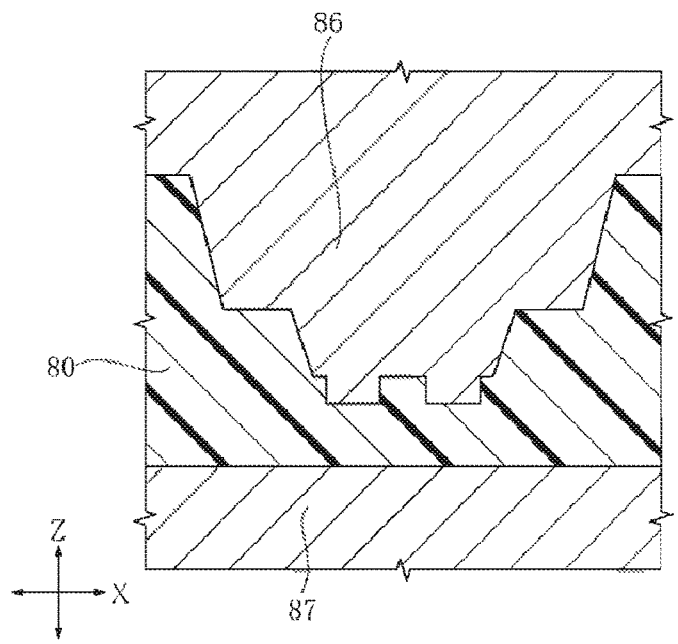
FIG. 7 is a cross-sectional view illustrating a step of making the semiconductor device shown in FIG. 1.

Then, as shown in FIG. 7, the base material 80 is formed by the mold 86. The base material 80 is an assembly of the substrate 1 of the semiconductor device A10. The base material 80 includes an electrical insulative synthetic resin.

In the present embodiment, the synthetic resin is a black epoxy resin containing a filler having $SiO_2$. The base material 80 is formed by the resin using the mold 86 as a core, and is between the mold 86 and a lower mold 87 having a flat plane during formation. While forming the base material 80, a fluorine-based release agent is applied to the surface of the mold 86, then the synthetic resin is filled in a cavity formed by the mold 86 and the lower mold 87, and thermal curing is performed.

Then, as shown in FIG. 8, the formed base material 80 is removed from the mold 86. The base material 80 has a main surface 801. The base material 80 is formed with a groove portion 81 recessed from the main surface 801 and having a bottom surface 811. The groove portion 81 is corresponding to the recess 14 of the substrate 1 of the semiconductor device A10. A plurality of groove portions 81 are equally spaced along the first direction X, and recessed from the main surface 801 to be formed in the base material 80 of the present embodiment. Further, each groove portion 81 extends along the second direction Y. In the base material 80 shown in FIG. 8, a range corresponding to the substrate 1 of the semiconductor device A10 is indicated by an imaginary line.

Both FIG. 9 and FIG. 10 show the cross section of the base material 80 with respect to the second direction Y. The main surface 801 is formed by the base surface 862 of the mold 86. The groove portion 81 is formed by the top surface 861 and the connecting surface 863 of the mold 86. Further, the groove portion 81 has a pair of connecting surfaces 812 connected to the main surface 801 and the bottom surface 811, and spaced apart from each other along the first direction X. Each connecting surface 812 includes a first inclined surface 812a, a second inclined surface 812b and an intermediate surface 812c. The first inclined surface 812a has one end connected to the bottom surface 811, and is inclined with respect to the bottom surface 811. The second inclined surface 812b has one end connected to the main surface 801, and is inclined with respect to the main surface 801. The intermediate surface 812c is connected to another end of the first inclined surface 812a and anther end of the second inclined surface 812b. In the step of forming the base material 80, the first inclined surface 812a, the second inclined surface 812b and the intermediate surface 812c are formed by using the mold 86 as a core.

Further, as shown in FIG. 9, in the step of forming the base material 80 of the present embodiment, a hole 811a recessed from the bottom surface 811 of the groove portion 81 and not penetrating the base material 80 is formed by the protrusion 861a of the mold 86. The shape of the hole 811a is a cylindrical shape (not shown).

Then, as shown in FIG. 11 to FIG. 18, a conductive layer 82 in contact with the base material 80 including the groove portion 81 is formed. The conductive layer 82 is corresponding to the wiring portion 20 of the semiconductor device A10. The step of forming the conductive layer 82 includes the step of forming a base layer 821 in contact with the base material 80, the step of forming a mask for forming a plating layer 822 on the base layer 821; and the step of forming the plating layer 822 in contact with the base layer 821. Further, in the present embodiment, the step of forming the conductive layer 82 includes: the step of forming a conductive pillar 823 filled in the hole 811a recessed from the bottom surface 811 of the groove portion 81; and the step of forming a bonding layer 832 in contact with the conductive layer 82 in contact with the groove portion 81. The conductive layer 82, the conductive pillar 823 and the bonding layer 832 are formed by the following steps.

Figure 11:
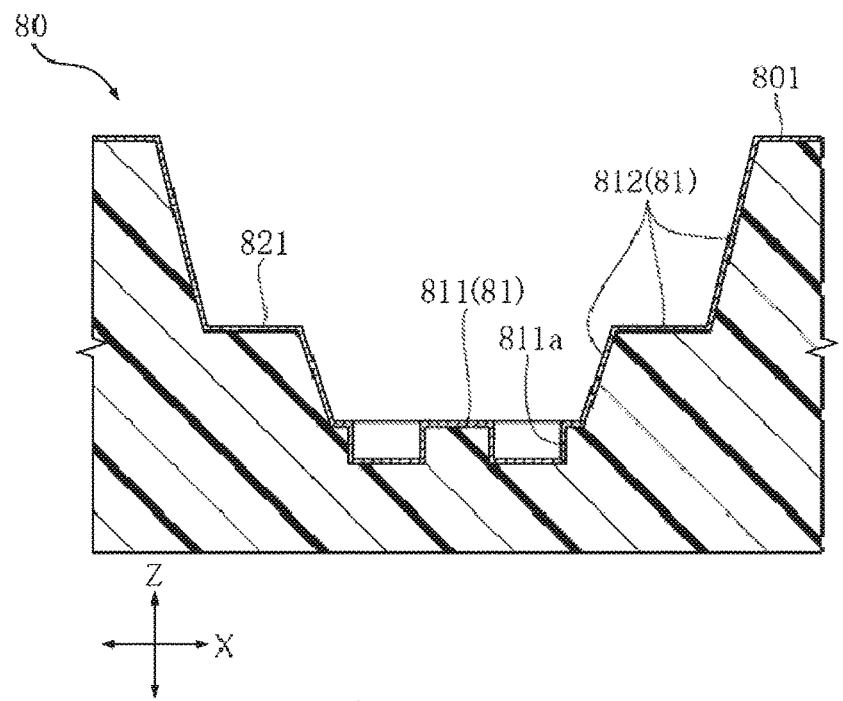
FIG. 11 is a cross-sectional view illustrating a step of making the semiconductor device shown in FIG. 1.

First, as shown in FIG. 11, a base layer 821 is formed to be in contact with the base material 80. The base layer 821 is corresponding to the base layer 201 of the wiring portion 20 of the semiconductor device A10. The base layer 821 is formed in a range of the whole of the main surface 801 of the base material 80 and the whole of the bottom surface 811 and the connecting surface 812 of the groove portion 81. The base layer 821 is formed by sputtering. In the present embodiment, the base layer 821 includes a Ti layer and a Cu layer laminated to each other, and has a thickness of 200-300 nm. During the formation of the base layer 821, after forming the Ti layer in contact with the base material 80, the Cu layer is formed to be in contact with the Ti layer. At this time, in addition to the whole surface of the main surface 801 and the whole surface of the bottom surface 811 and the connecting surface 812 of the groove portion 81, the inner surface of the hole 811a recessed from the bottom surface 811 is entirely covered by the base layer 821.

Figure 12:
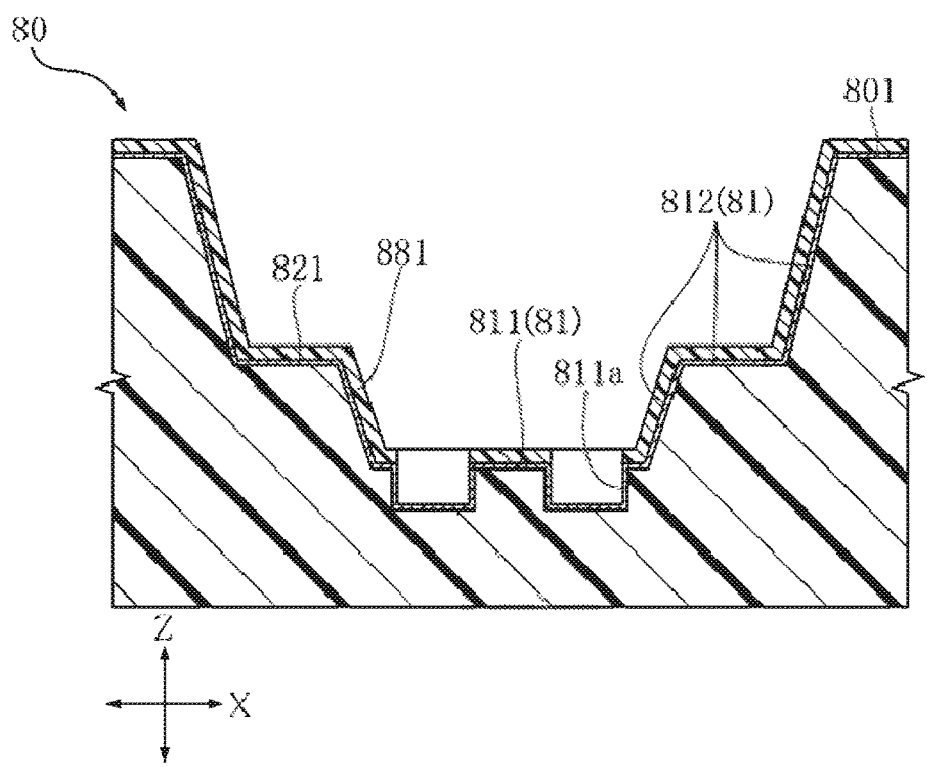
FIG. 12 is a cross-sectional view illustrating a step of making the semiconductor device shown in FIG. 1.

Then, a mask for forming a conductive pillar 823 is formed on the base layer 821 by photolithography. As shown in FIG. 12, after forming a first mask layer 881 on the base material 80 by covering the base layer 821, the first mask layer 881 is exposed and developed, thereby forming the mask. The first mask layer 881 is formed by, for example, applying a photosensitive photoresist to the base material 80 by using a spin coater (rotary coating device). In the present embodiment, the first mask layer 881 is a positive form, and thus a portion of the exposed first mask layer 881 is removed by the developer. The bottom layer 821 is exposed from the portion of the first mask layer 881 that is removed by exposure.

Figure 13:
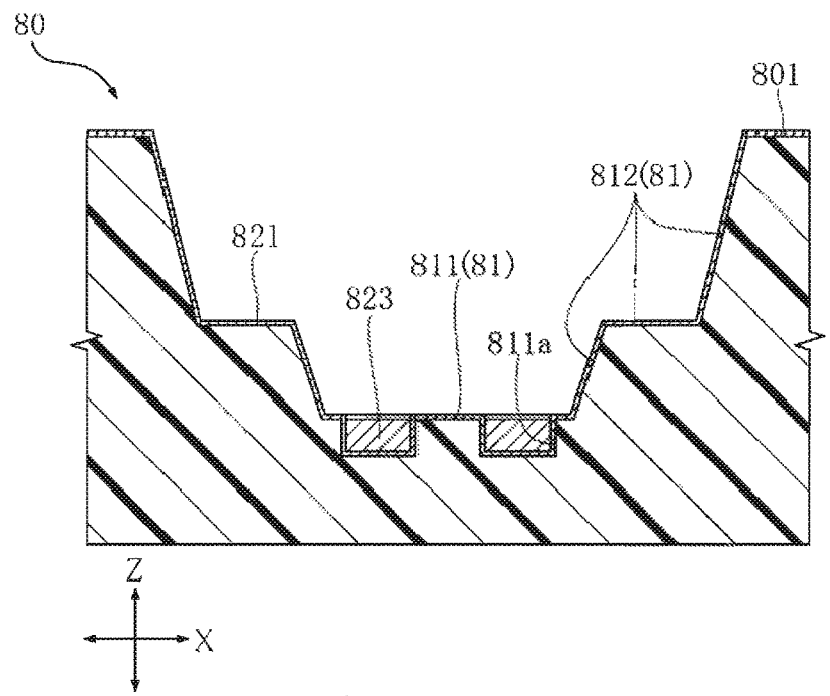
FIG. 13 is a cross-sectional view illustrating a step of making the semiconductor device shown in FIG. 1.

Then, as shown in FIG. 13, a conductive pillar 823 filled in the hole 811a recessed from the bottom surface 811 of the groove portion 81 is formed. The conductor pillar 823 is corresponding to the pillar 291 of the terminal portion 29 of the semiconductor device A10. In the present embodiment, the conductive pillar 823 includes Cu, and is formed by electrolytic plating and using the base layer 821 as a conductive pathway. At this time, a part of the conductive pillar 823 is exposed from the bottom surface 811 of the groove portion 81. After forming the conductive pillar 823, the first mask layer 881 formed on the base material 80 is entirely removed.

Figure 14:
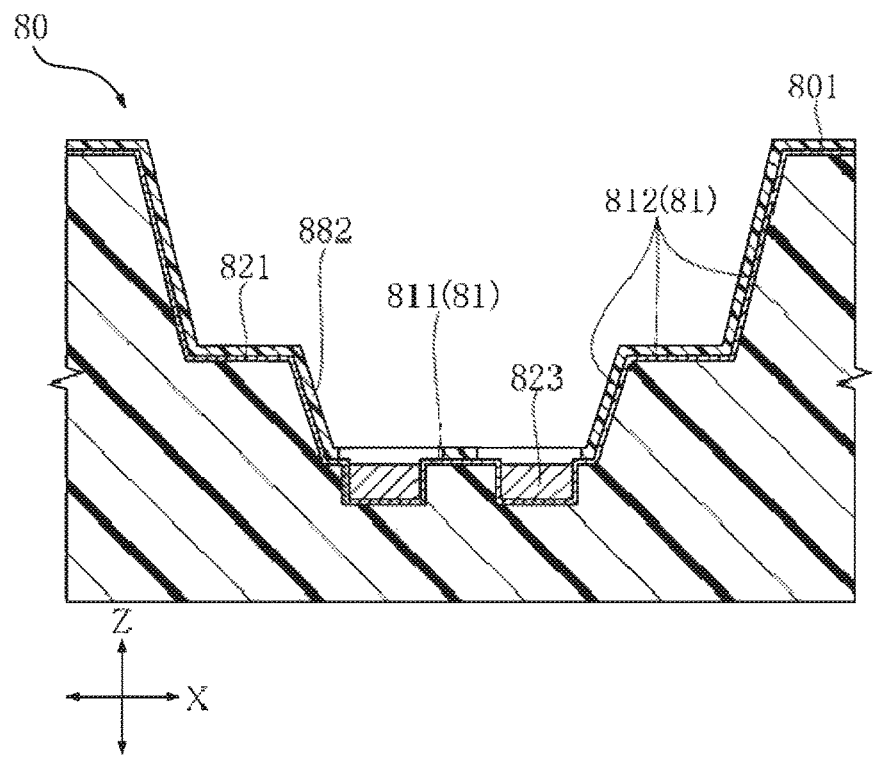
FIG. 14 is a cross-sectional view illustrating a step of making the semiconductor device shown in FIG. 1.

Then, a mask for forming a plating layer 822 is formed on the base layer 821 by photolithography. As shown in FIG. 14, after the second mask layer 882 is formed on the base material 80 by covering a portion of the base layer 821 and a portion of the conductive pillar 823, the second mask layer 882 is exposed and developed, thereby forming the mask on the base layer 821. The configuration and the formation method of the second mask layer 882 are the same as those of the first mask layer 881. At this time, the base layer 821 and a portion of the conductive pillar 823 are exposed from the portion of the second mask layer 882 which is removed by exposure.

Figure 15:
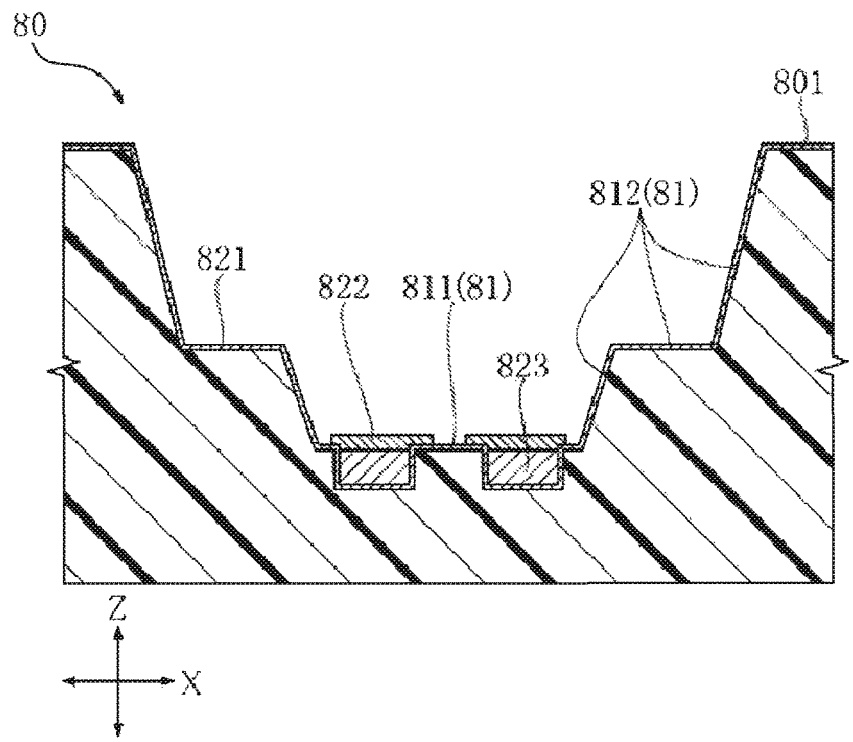
FIG. 15 is a cross-sectional view illustrating a step of making the semiconductor device shown in FIG. 1.

Then, as shown in FIG. 15, the plating layer 822 in contact with the base layer 821 exposed from the second mask layer 882 is formed. The plating layer 822 is corresponding to the plating layer 202 of the wiring portion 20 of the semiconductor device A10. In the present embodiment, the plating layer 822 is formed by electrolytic plating using the base layer 821 as the conductive pathway. Further, in the present embodiment, the plating layer 822 includes Cu, and has a thickness of 3-10 μm. At this time, a portion of the conductive pillar 823 exposed from the bottom surface 811 of the groove portion 81 is in contact with the plating layer 822.

After forming the plating layer 822, the second mask layer 882 formed on the base material 80 is entirely removed.

Figure 16:
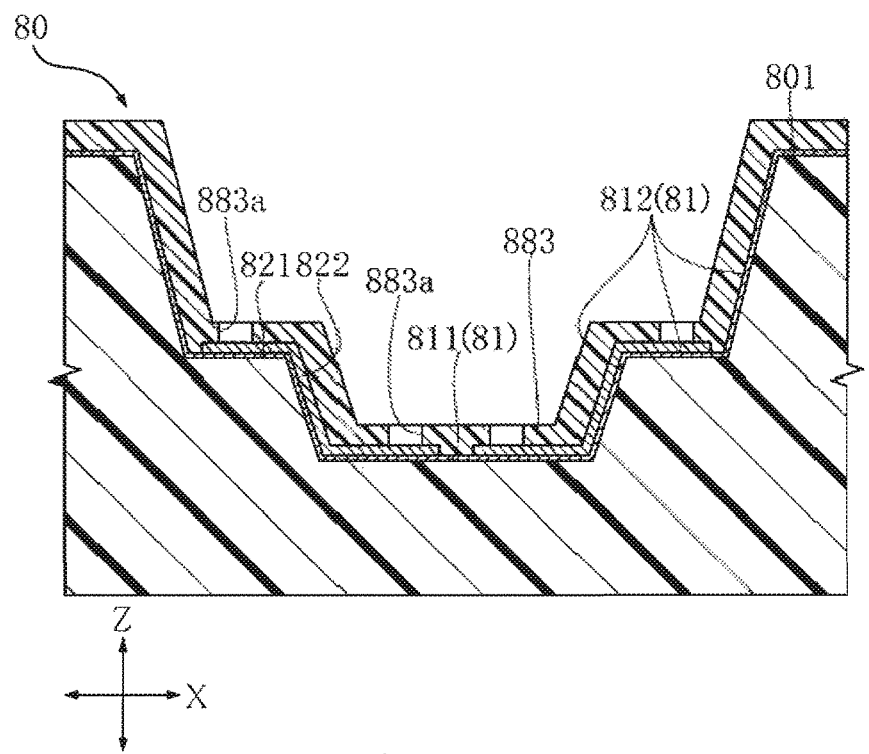
FIG. 16 is a cross-sectional view illustrating a step of making the semiconductor device shown in FIG. 1.

Then, a mask for forming a bonding layer 832 is formed on the base layer 821 and the plating layer 822 by photolithography. As shown in FIG. 16, after a third mask layer 883 is formed on the base material 80 by covering the base layer 821 and the plating layer 822, the third mask layer 883 is exposed and developed, thereby forming the mask on the base layer 821 and the plating layer 822. The configuration and the formation method of the third mask layer 883 are the same as those of the first mask layer 881. At this time, an opening 883a is formed in the third mask layer 883 by exposure. In the present embodiment, the opening 883a is formed in the conductive layer 82 formed to be in contact with the bottom surface 811 of the groove portion 81, and in the conductive layer 82 formed to be in contact with the intermediate layer 812c of the groove portion 81. Further, in the present embodiment, the shape of the opening 883a is a rectangular shape (not shown).

Figure 17:
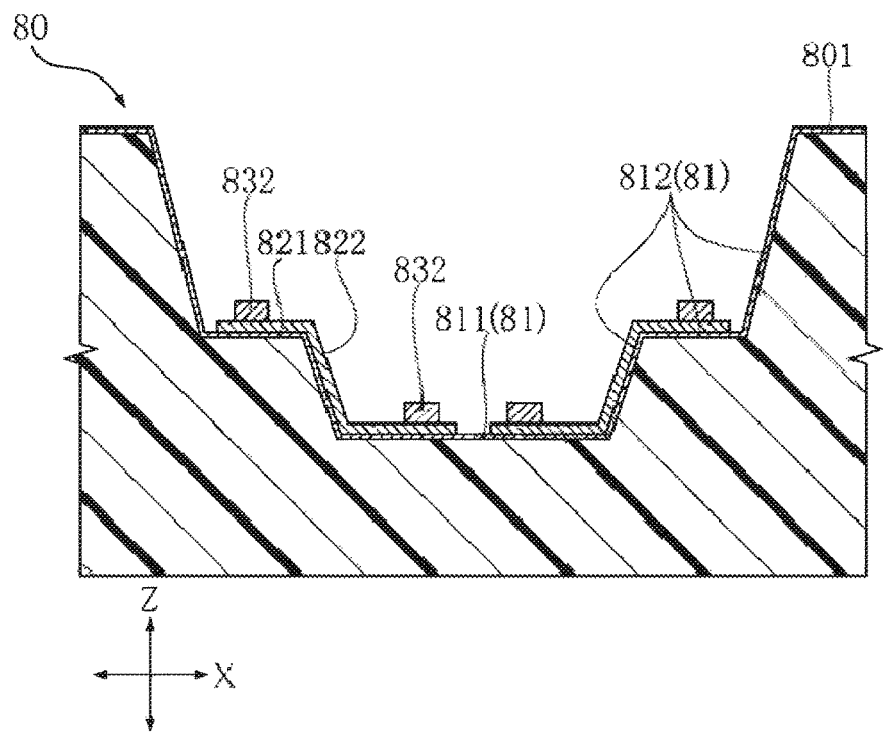
FIG. 17 is a cross-sectional view illustrating a step of making the semiconductor device shown in FIG. 1.

Then, as shown in FIG. 17, a bonding layer 832 in contact with the conductive layer 82 formed to be in contact with the groove portion 81 is formed. The bonding layer 832 is corresponding to the bonding layer 32 of the semiconductor device A10. In the present embodiment, the bonding layer 832 is formed to be in contact with the conductive layer 82, which is formed with an opening 883a of the third mask layer 883. The bonding layer 832 is formed by electrolytic plating, using the base layer 821 and the plating layer 822 as the conductive pathway, and filling the opening 883a of the third mask layer 883. Further, in the present embodiment, the bonding layer 832 includes a Ni layer and an alloy layer containing Sn laminated to each other. The alloy layer is, for example, a lead-free solder such as a Sn—Sb alloy or a Sn—Ag alloy. After forming the bonding layer 832, the third mask layer 883 formed on the base material 80 is entirely removed.

Figure 18:
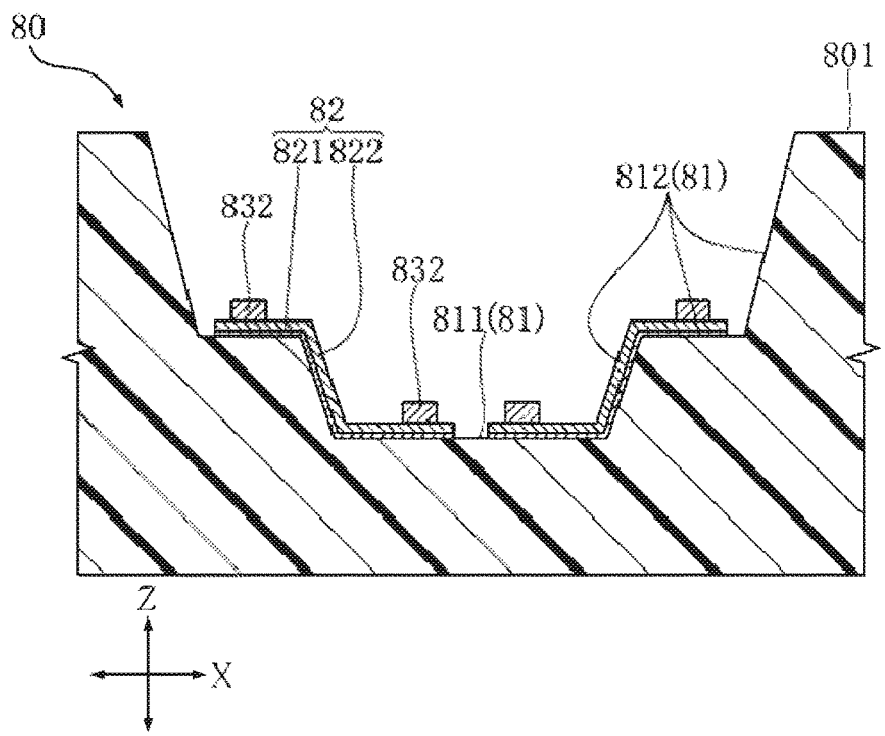
FIG. 18 is a cross-sectional view illustrating a step of making the semiconductor device shown in FIG. 1.

Then, as shown in FIG. 18, in the base material 80, the excess of the base layer 821 which is not covered by the plating layer 822 is completely removed. The base layer is removed by, for example, wet etching. In the wet etching, mixed solution of $H_2SO_4$ (sulfuric acid) and $H_2O_2$ (hydrogen peroxide) is used, for example. The bottom surface 811 and the connecting surface 812 of the groove portion 81 are exposed from the portion where the base layer 821 is removed. In this situation, the base layer 821 and the plating layer 822 laminated to each other are the conductive layer 82. The conductive layer 82, the conductive pillar 823 and the bonding layer 832 are formed by the above steps.

Figure 19:
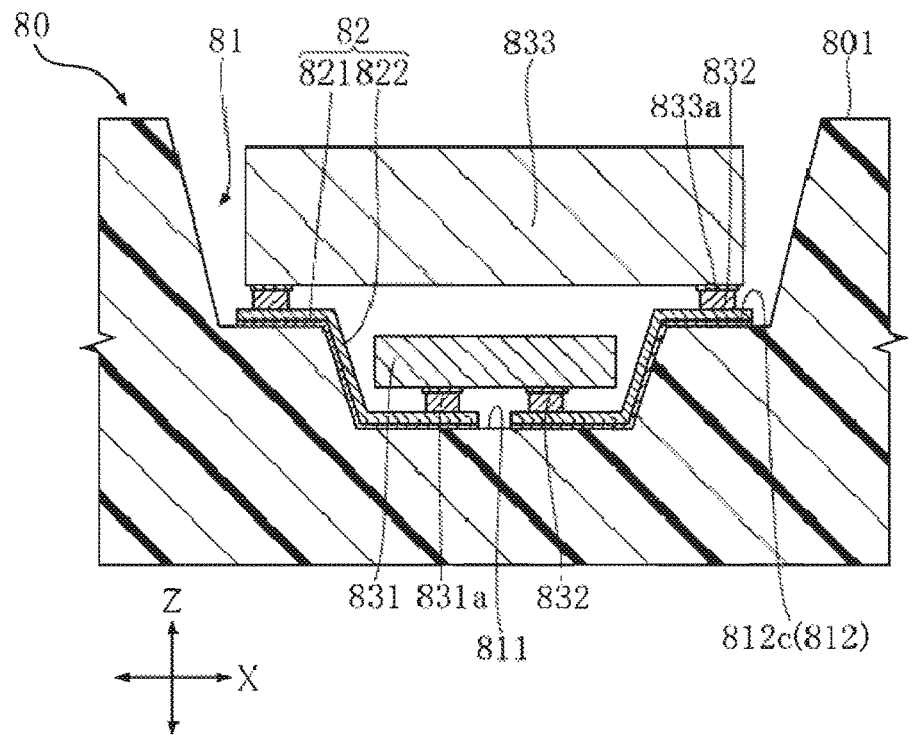
FIG. 19 is a cross-sectional view illustrating a step of making the semiconductor device shown in FIG. 1.

Then, as shown in FIG. 19, a semiconductor element 831 is mounted on the bottom surface 811 of the groove portion 81 so as to be accommodated in the groove portion 81. In the present embodiment, after the semiconductor element 831 is mounted on the bottom surface 811, an inductor 833 is mounted on an intermediate surface 812c of the connecting surface 812 of the groove portion 81. The semiconductor element 831 is corresponding to the semiconductor element 31 of the semiconductor device A10, and the inductor 833 is corresponding to the inductor 33 of the semiconductor device A10. The mounting of the semiconductor element 831 is performed by FCB (Flip Chip Bonding). After a flux is applied to the electrode bump 831a of the semiconductor element 831, the semiconductor element 831 is temporarily mounted on the bonding layer 832, which is in contact with the conductive layer 82 formed to be in contact with the bottom surface 811, by a flip chip bonding machine. At this time, the bonding layer 832 is between the conductive layer 82 and the semiconductor element 831. Then, after the bonding layer 832 is melted by reflowing, the bonding layer 832 is solidified by cooling, thereby completing the mounting of the semiconductor element 831. Further, the inductor 833 is mounted by the FCB in the same manner as the semiconductor element 831. In this situation, the flux is applied to the electrode bump 833a of the inductor 833, and then the inductor 833 is temporarily mounted on the bonding layer 832, which is in contact with the conductive layer 82 formed to be in contact with the intermediate surface 812c of the connecting surface 812, by a flip chip bonding machine. The subsequent mounting of the inductor 33 is the same as the mounting of the semiconductor element 831.

Figure 20:
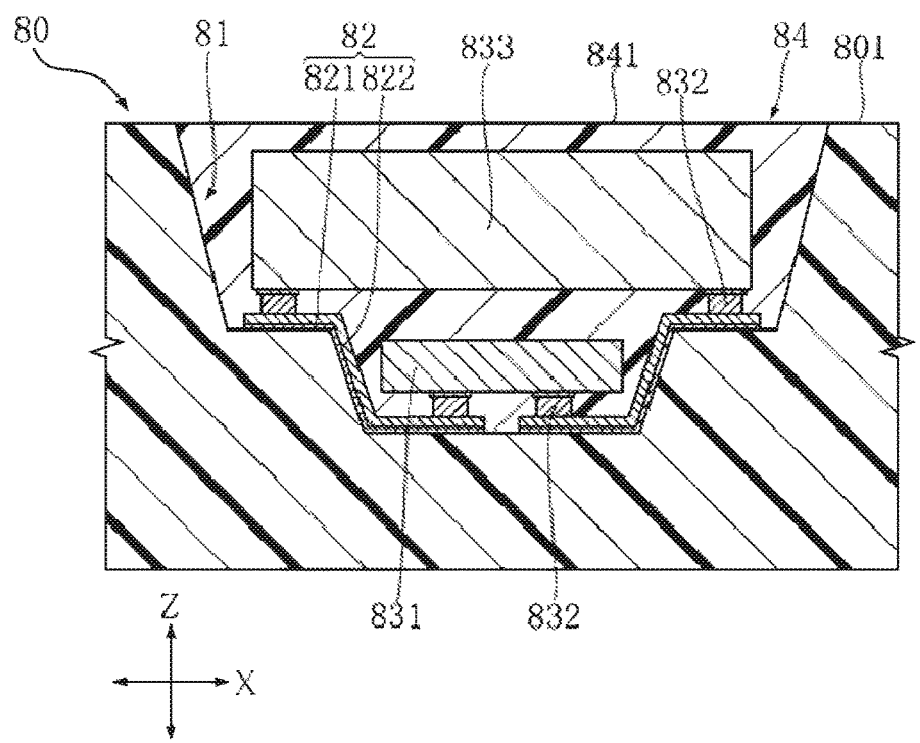
FIG. 20 is a cross-sectional view illustrating a step of making the semiconductor device shown in FIG. 1.

Then, as shown in FIG. 20, a sealing resin 84 is formed to cover the semiconductor element 831 and to be filled in the groove portion 81. In the present embodiment, the conductive layer 82 and the inductor 833 are also covered by the sealing resin 84. The sealing resin 84 is corresponding to the sealing resin 4 of the semiconductor device A10. In the present embodiment, the sealing resin 84 includes an electrical insulative synthetic resin, and includes the same material as the base material 80. Therefore, the synthetic resin includes a black epoxy resin containing a filler having $SiO_2$. The sealing resin 84 is formed so that the upper surface of the sealing resin 84 shown in FIG. 20, i.e. the main surface 841 of the resin, and the main surface 801 of the base material 80 are formed in the same plane.

Figure 21:
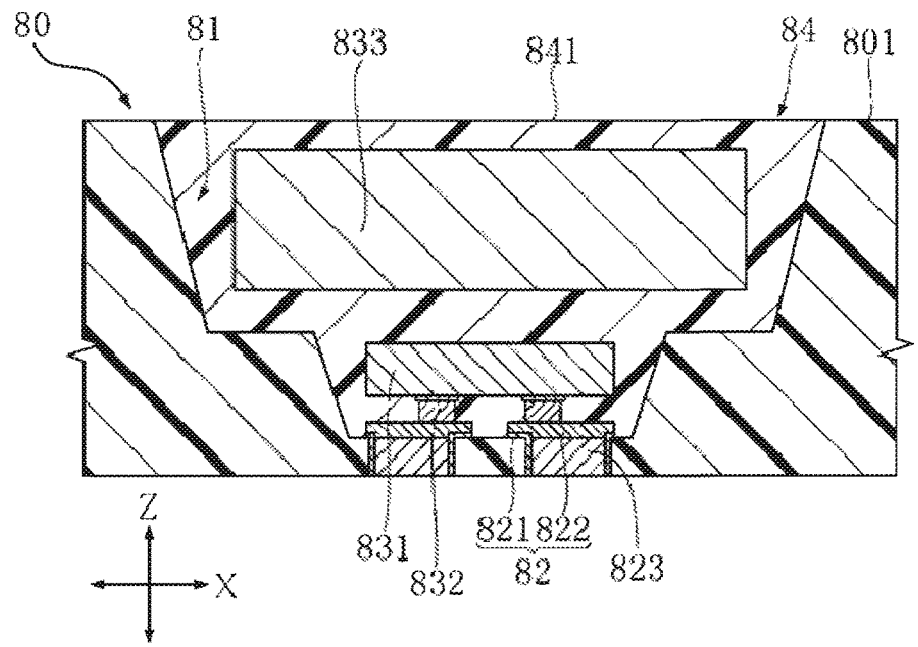
FIG. 21 is a cross-sectional view illustrating a step of making the semiconductor device shown in FIG. 1.

Then, as shown in FIG. 21, a portion of the base material 80 on the side opposite to the main surface 801 is removed in the thickness direction Z of the base material 80, so that a portion of the conductive pillar 823 is exposed from the base material 80. The removal is performed by, for example, mechanical grinding.

Figure 22:
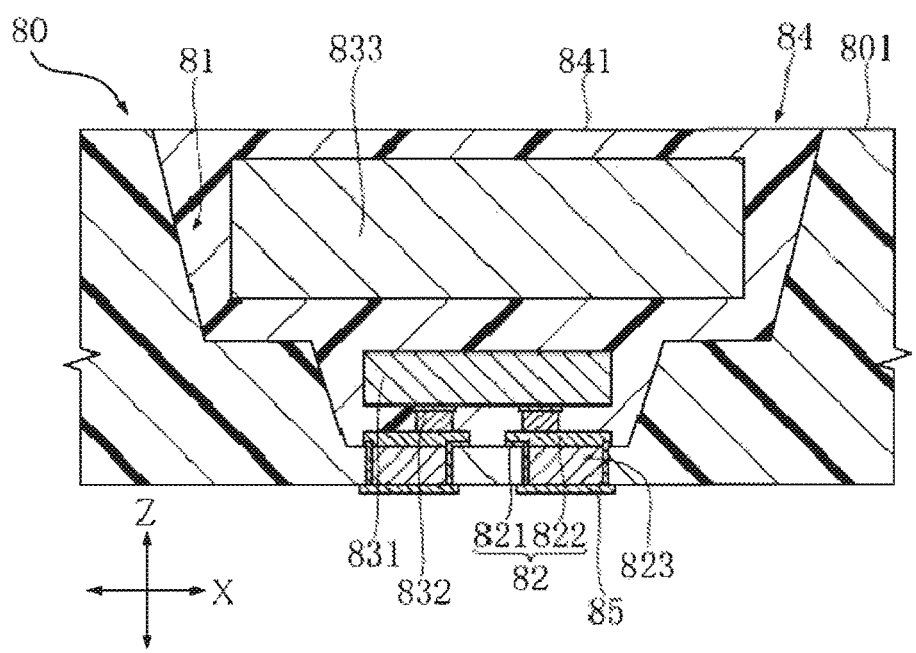
FIG. 22 is a cross-sectional view illustrating a step of making the semiconductor device shown in FIG. 1.
Figure 23:
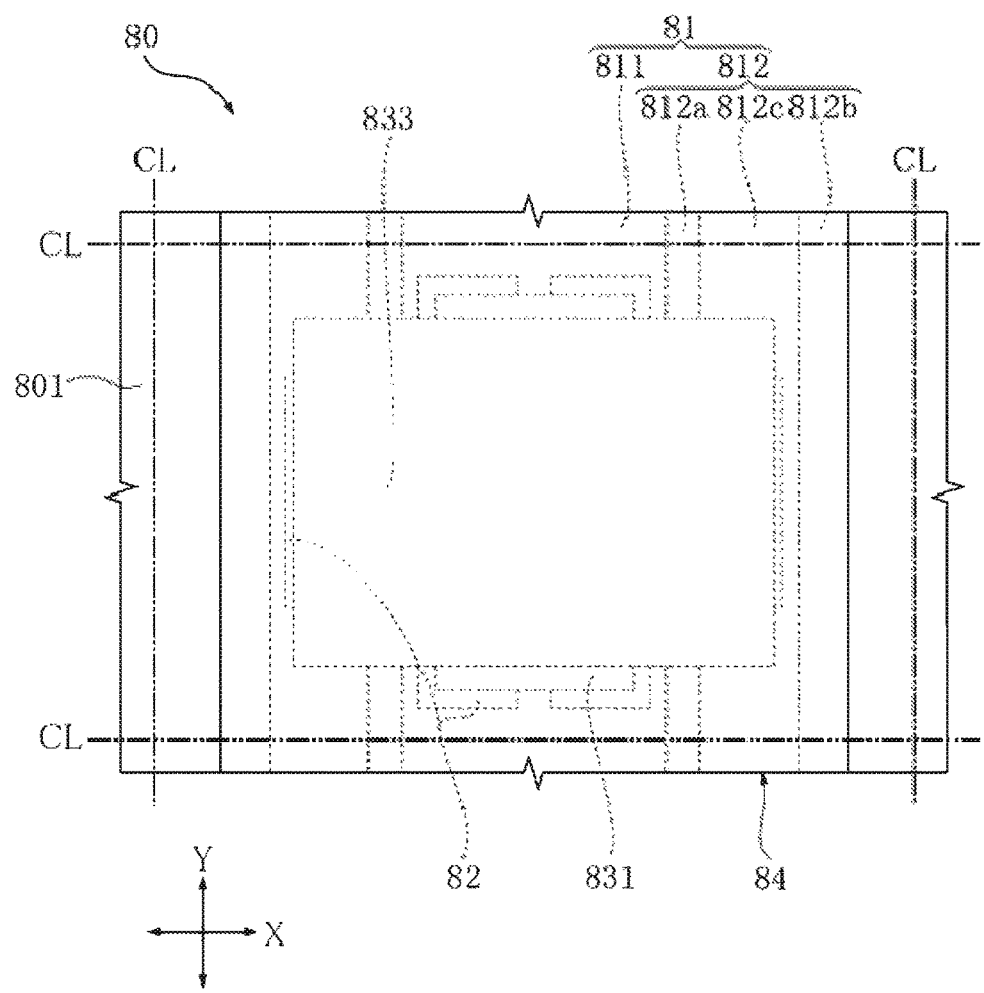
FIG. 23 is a top view illustrating a step of making the semiconductor device shown in FIG. 1.

Then, as shown in FIG. 22, a pad 85 is formed to be in contact with the portion of the conductive pillar 823 exposed from the base material 80. The pad 85 is corresponding to the pad 292 of the terminal portion 29 of the semiconductor device A10. In the present embodiment, the pad 85 includes a Ni layer, a Pd layer and an Au layer laminated to each other. The pad 85 is formed by electroless plating, in which the Ni layer, the Pd layer and the Au layer are precipitated in order.

Then, the base material 80 and the sealing resin 84 are cut along the first direction X, and the base material 80 is cut along the second direction Y, thereby dividing into a single slice of each range corresponding to the substrate 1 of the semiconductor device A10. When the cutting is performed, the base material 80 and the sealing resin 84 are cut along the cutting line CL shown in FIG. 23 by, for example, plasma cutting. The single slice formed by dividing in this step becomes the semiconductor device A10. The semiconductor device A10 is made by the above steps.

Then, the effects of the semiconductor device A10 and a method of making the same are illustrated.

The semiconductor device A10 includes a substrate 1. The substrate 1 includes an electrical insulative synthetic resin and is formed with a recess 14 recessed from a main surface 11, wherein the recess has a semiconductor element 31 disposed therein. The recess 14 has a bottom surface 141 and the semiconductor element 31 is disposed on the bottom surface 141, and a connecting surface 142 connected to the bottom surface 141 and the main surface 11. The connecting surface 142 includes a first inclined surface 142a having one end connected to the bottom surface 141 and inclined with respect to the bottom surface 141; and a second inclined surface 142b having one end connected to the main surface 11 and inclined with respect to the main surface 11. Further, the connecting surface 142 includes an intermediate surface 142c connected to another end of the first inclined surface 142a and another end of the second inclined surface 142b. By this configuration, the thermal expansion coefficient of the substrate 1 becomes close to the thermal expansion coefficient of the sealing resin 4, such that the distribution of the temperature strain in the thickness direction Z of the substrate 1 is substantially uniform. Further, by forming the connecting surface 142 of the recess 14 of the substrate 1, the substrate 1 and the sealing resin 4 are engaged with each other in the first direction X. Thus, in the formation of the sealing resin 84 during the process of making the semiconductor device A10, the base material 80 and the sealing resin 84 are integrated and have uniform thermal expansion. The difference between the temperature strains of the base material 80 and the sealing resin 84 is minor. Therefore, during the process of making the semiconductor device A10, warpage due to the difference of temperature strains are suppressed.

Further, in the formation of the base material 80 during the process of making the semiconductor device A10, the mold 86 is used as a core, and the first inclined surface 812a, the second inclined surface 812b and the intermediate surface 812c of the recess 81 are formed. The mold 86 includes $SiO_2$ as an oxide film of a single crystal intrinsic semiconductor material, and is formed by isotropic etching. Therefore, the mold 86 can be finely machined, such that the base material 80 of the groove portion 81 having a plurality of connecting surfaces 812 can be formed by the mold 86.

The reduction in the thermal expansion coefficient of the substrate 1 can be achieved by setting the substrate 1 to the epoxy resin containing the filler having $SiO_2$. Therefore, in the formation of the base material 80 during the process of making the semiconductor device A10, the temperature strain of the base material 80 along with heating and cooling becomes smaller. The dimensional error of the base material 80 can be suppressed to be smaller. In this situation, the sealing resin 4 is configured to be the same material as that of the substrate 1, whereby the warpage of the article due to the difference of temperature strains can be further suppressed in the formation of the sealing resin 84 during the process of making the semiconductor device A10. Further, the filler containing $SiO_2$ also helps to increase the hardness of the synthetic resin contained or to improve the flow of the synthetic resin when the resin is formed.

The connecting surface 142 of the recess 14 includes the intermediate surface 142c connected to the first inclined surface 142a and the second inclined surface 142b. By forming the wiring portion 20 (connecting surface wiring portion 22) connected to the intermediate surface 142c, an element (the inductor 33 in the present embodiment) other than the semiconductor element 31 can be mounted on the intermediate surface 142c. Therefore, the intermediate surface 142c helps creation of accommodation space for elements.

The wiring portion 20 includes the base layer 201 and the plating layer 202 laminated to each other, and the base layer 201 is connected to the substrate 1. Further, the base layer 201 includes the Ti layer and the Cu layer laminated to each other. The Ti layer is well adhered to the substrate 1 including the synthetic resin, and thus the effect of preventing the Cu layer from peeling off with respect to the substrate 1 is achieved. In the formation of the conductive layer 82 during the process of making the semiconductor device A10, the plating layer 822 can be efficiently formed by electroplating and by using the base layer 201.

In the mounting of the semiconductor element 831 during the process of making the semiconductor device A10, the semiconductor element 831 can be accurately mounted to the groove portion 81 of the base material 80 by FCB and by using the bonding layer 32. Therefore, in comparison with the situation that the semiconductor element 831 is mounted to the groove portion 81 by wire bonding, the size of the groove portion 81 can be reduced. This helps the miniaturization of the semiconductor device A10.

Second Embodiment

The semiconductor device A20 according to the second embodiment of the present invention is described with reference to FIG. 24 to FIG. 26. In these figures, elements identical or similar to those of the semiconductor device A10 are denoted by the same reference numerals, and the repetitive descriptions are omitted.

Figure 24:
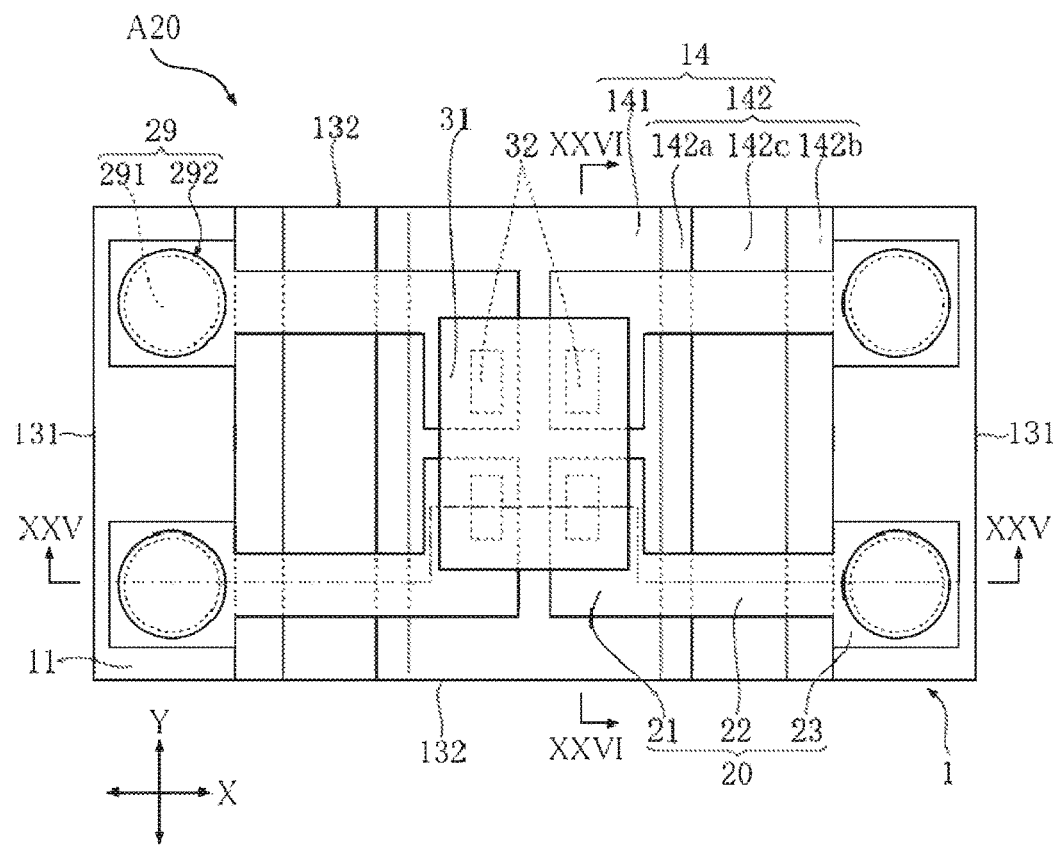
FIG. 24 is a top view (through a sealing resin) showing a semiconductor device according to a second embodiment of the present invention.

FIG. 24 is a top view of the semiconductor device A20 through the sealing resin 4 for ease of understanding. FIG. 25 is a cross-sectional view taken along line XXV-XXV in FIG. 24 (the dots-and-dash line shown in FIG. 24). FIG. 26 is a cross-sectional view taken along line XXVI-XXVI in FIG. 24.

For the semiconductor device A20 in the present embodiment, the configurations of the wiring portion 20, the terminal portion 29 and the semiconductor element 31 are different from that of the semiconductor device A10. Further, the semiconductor device A20 includes no inductor 33. The semiconductor device A20 is a magnetic sensor mounted on the surface of a circuit substrate of various electronic devices. As shown in FIG. 24, the shape of the semiconductor device A20 in a top view is a rectangular shape.

Figure 25:
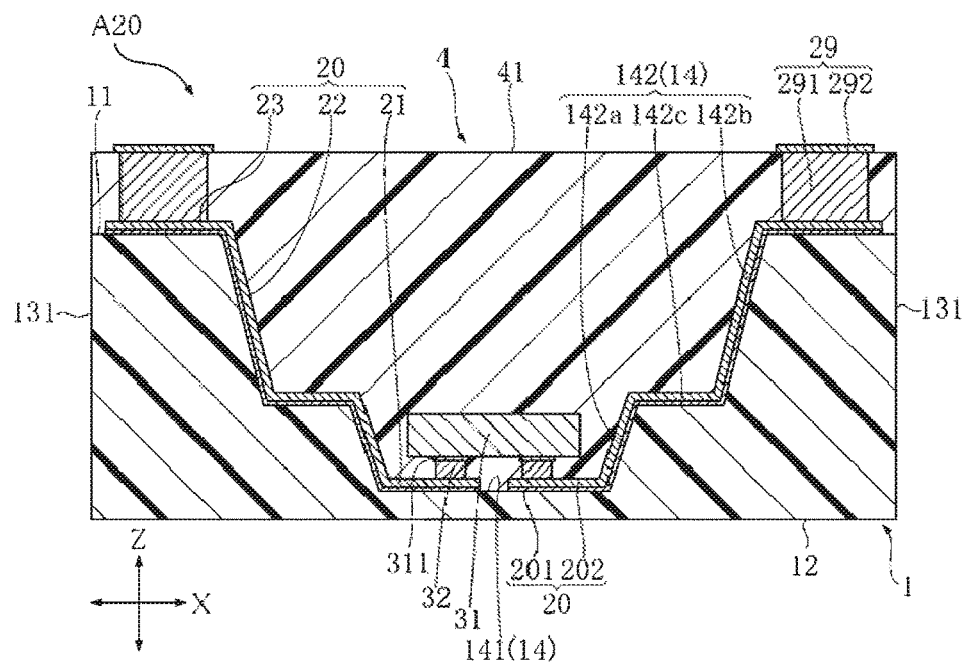
FIG. 25 is a cross-sectional view taken along line XXV-XXV of FIG. 24.

As shown in FIG. 24 and FIG. 25, in addition to the bottom surface wiring portion 21 and the connecting surface wiring portion 22, the wiring portion 20 of the present embodiment includes a main surface wiring portion 23 connected to the main surface 11 of the substrate 1. The configuration of the main surface wiring portion 23 is the same as that of the bottom surface wiring portion 21 and the connecting surface wiring portion 22, and includes the base layer 201 and the plating layer 202 laminated to each other. Further, in the present embodiment, a pillar 291 is configured to be in contact with the main surface wiring portion 23, and the main surface wiring portion 23 is covered by the sealing resin 4.

As shown in FIG. 24 and FIG. 25, the pillar 291 of the terminal portion 29 in the present embodiment has one end connected to the main surface wiring portion 23, and another end connected to a pad 292 of the terminal portion 29. Further, the side surface of the pillar 291 is covered by the sealing resin 4, and a portion of the pillar 291 is exposed from the resin main surface 41 of the sealing resin 4. Therefore, in the present embodiment, the pillar 291 is disposed between the main surface wiring portion 23 and the pad 292. Further, the shape of the pillar 291 is a cylindrical shape, and the pillar 291 includes Cu.

Figure 26:
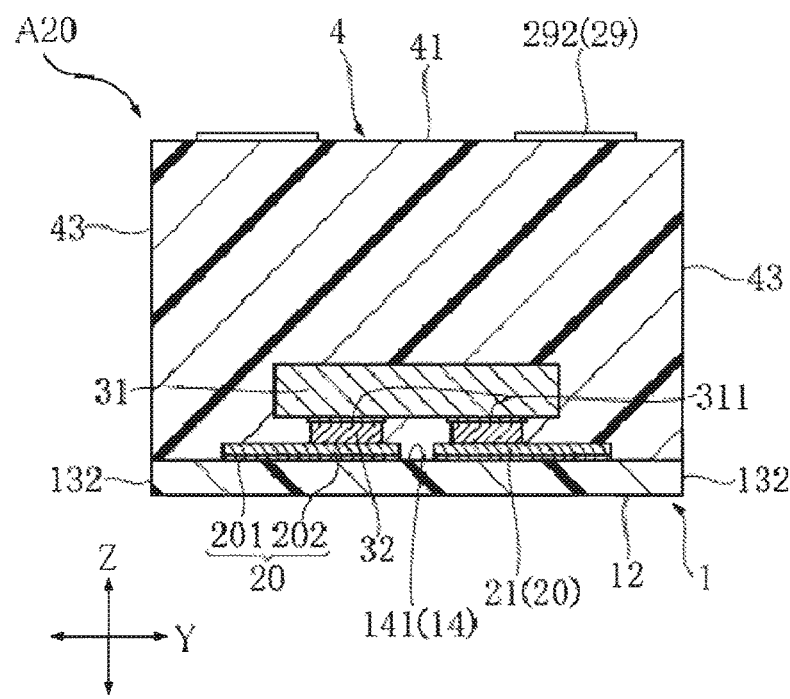
FIG. 26 is a cross-sectional view taken along line XXVI-XXVI of FIG. 24.

As shown in FIG. 24 to FIG. 26, the semiconductor element 31 of the present embodiment is connected to the bottom surface wiring portion 21 via the bonding layer 32 in the same manner as the semiconductor element 31 of the semiconductor device A10, and is mounted on the bottom surface 141 of the recess 14. Further, the semiconductor element 31 of the present embodiment is a Hall element, for example a GaAs type Hall element. The GaAs type Hall element has the advantage that the Hall voltage is excellent in linearity with respect to the variation of the magnetic flux density and is hardly affected by the temperature change. On the lower surface of the semiconductor element 31 shown in FIG. 25 and FIG. 26, a magnetic induction surface (not shown) for detecting a change in the magnetic flux density is provided. Further, the semiconductor element 31 and the semiconductor element 31 of the semiconductor device A10 are both flip chip elements.

Then, an example of a method of making the semiconductor device A20 is illustrated based on FIG. 27 to FIG. 42.

Figure 29:
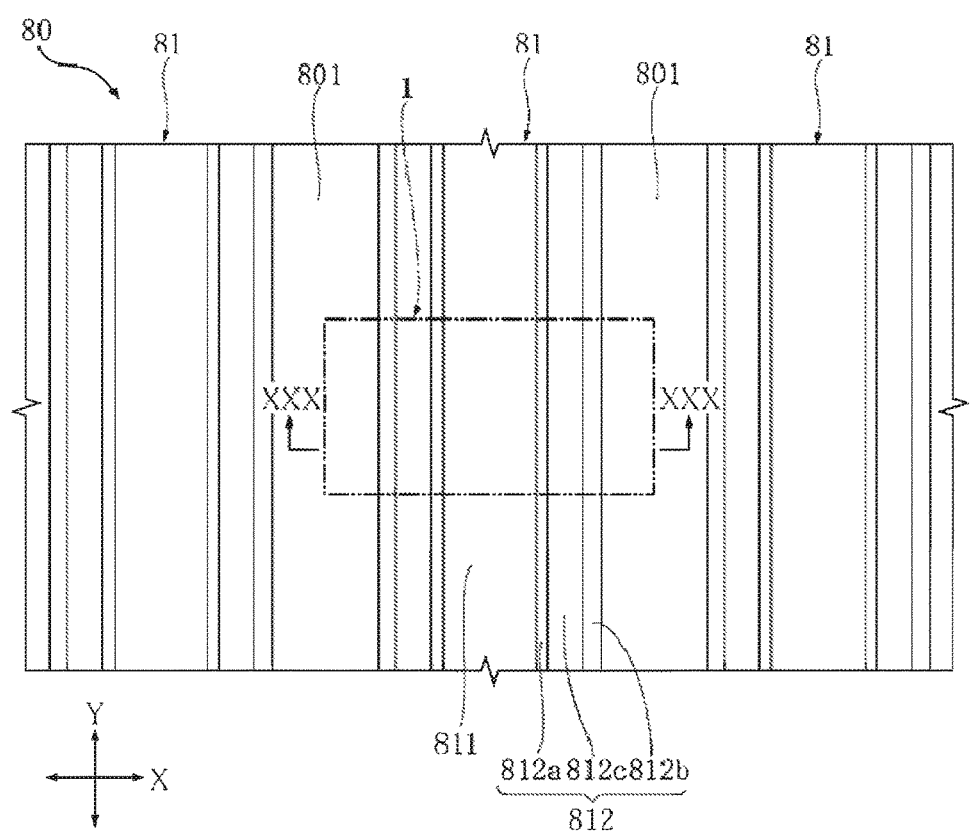
FIG. 29 is a top view illustrating a step of making the semiconductor device shown in FIG. 24.
Figure 30:
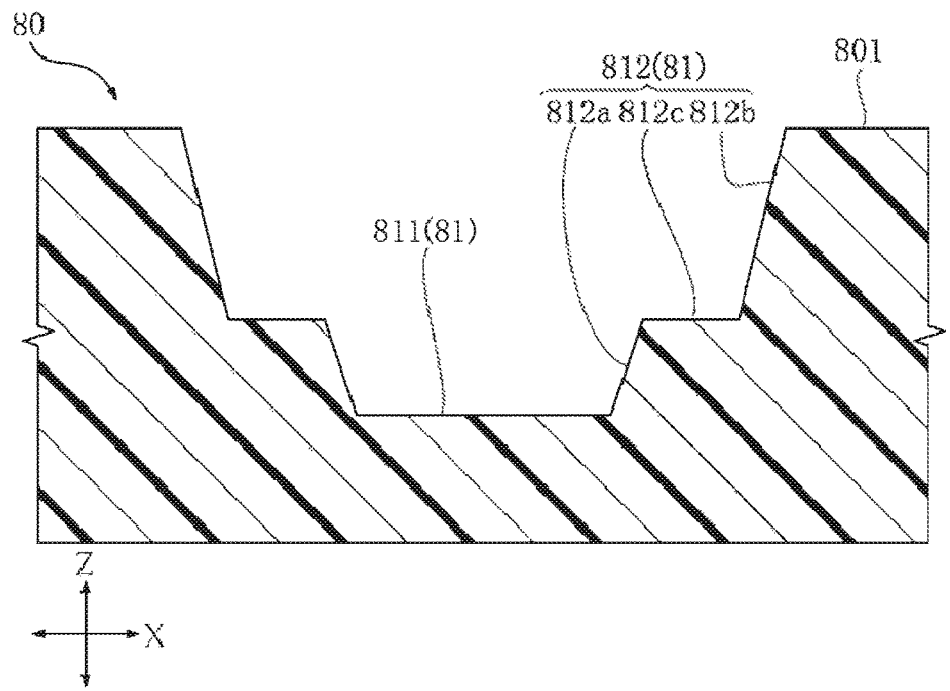
FIG. 30 is a cross-sectional view taken along line XXX-XXX of FIG. 29.

FIG. 27, FIG. 28 and FIG. 31 to FIG. 41 are cross-sectional views illustrating steps of making the semiconductor device A20. FIG. 29 and FIG. 42 are top views illustrating steps of making the semiconductor device A20. FIG. 30 is a cross-sectional view taken along line XXX-XXX in FIG. 29. Herein, the cross-sectional positions of FIG. 27, FIG. 28 and FIG. 31 to FIG. 41 are the same as those of FIG. 30.

Figure 27:
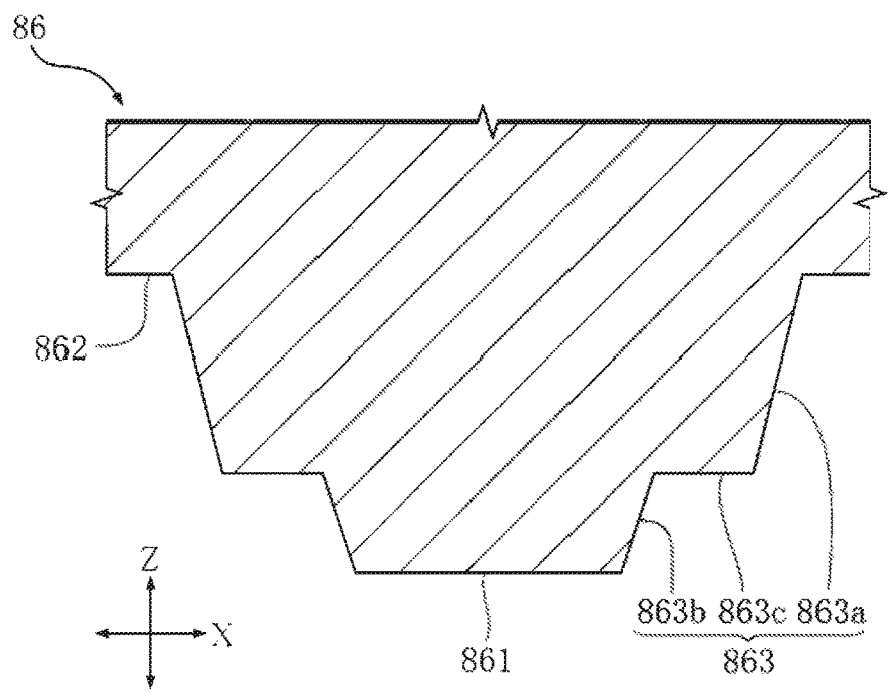
FIG. 27 is a cross-sectional view illustrating a step of making the semiconductor device shown in FIG. 24.

First, as shown in FIG. 27, a mold 86 is prepared. Unlike the mold 86 used for making the semiconductor device A10, the mold 86 in the present embodiment is not formed with a protrusion 861a protruding from the top surface 861. In addition to the protrusion 861a, the shape of the mold 86 is the same as that of the mold 86 used for making the semiconductor device A10.

Figure 28:
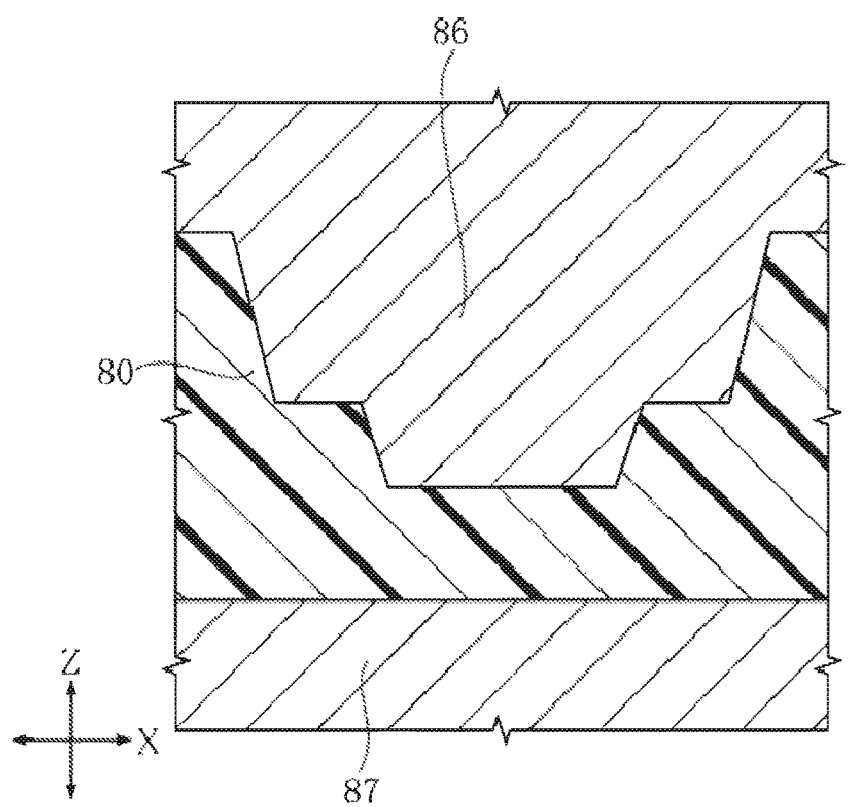
FIG. 28 is a cross-sectional view illustrating a step of making the semiconductor device shown in FIG. 24.

Then, as shown in FIG. 28, a base material 80 is formed by the mold 86. The material constituting the base material 80 and the formation method of the base material 80 are the same as those of the base material 80 of the semiconductor device A10. As shown in FIG. 29 and FIG. 30, after forming the base material 80, the formed base material 80 is taken out from the mold 86. The base material 80 is formed with a groove portion 81 having a bottom surface 811 and a pair of connecting surfaces 812 in the present embodiment in the same manner as the base material 80 when making the semiconductor device A10. Further, in the step of forming the base material 80, the mold 86 is used as a core, and a first inclined surface 812a, a second inclined surface 812b and an intermediate surface 812c of a connecting surface 812 are formed. However, the base material 80 in the present embodiment is not formed with a hole 811a recessed from the bottom surface 811 of the groove portion 81 and not penetrating the base material 80.

Then, as shown in FIG. 31 to FIG. 38, a conductive layer 82 is formed. In the present embodiment, the step of forming the conductive layer 82 includes: a step of forming a bonding layer 832; and a step of forming a conductive pillar 823. The conductive pillar is in contact with the conductive layer 82 which is in contact with the main surface 801 of the base material 80, and protrudes opposite to the bottom surface 811 of the groove portion 81 with respect to the main surface 801. Further, the step of forming the conductive layer 82, similar to the conductive layer 82 while making the semiconductor device A10, includes: a step of forming a base layer 821; a step of forming a mask on the base layer 812 for forming a plating layer 822; and a step of forming the plating layer 822.

Figure 31:
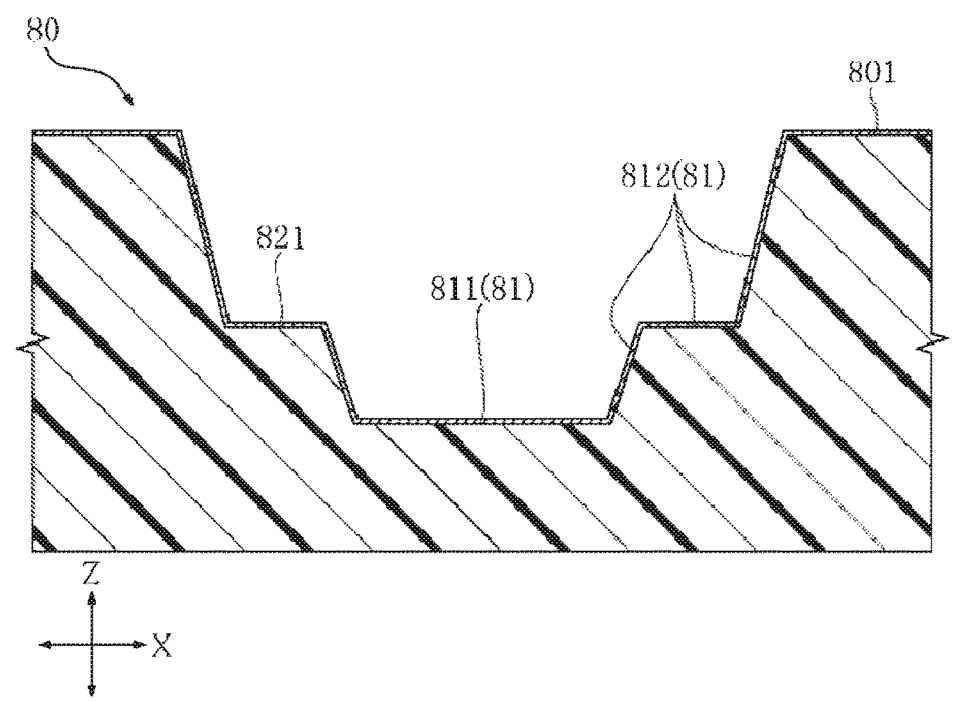
FIG. 31 is a cross-sectional view illustrating a step of making the semiconductor device shown in FIG. 24.

First, as shown in FIG. 31, the base layer 821 is formed to be in contact with the base material 80. The configuration and the formation method of the base layer 821 are the same as those of the base layer 821 for making the semiconductor device A10.

Figure 32:
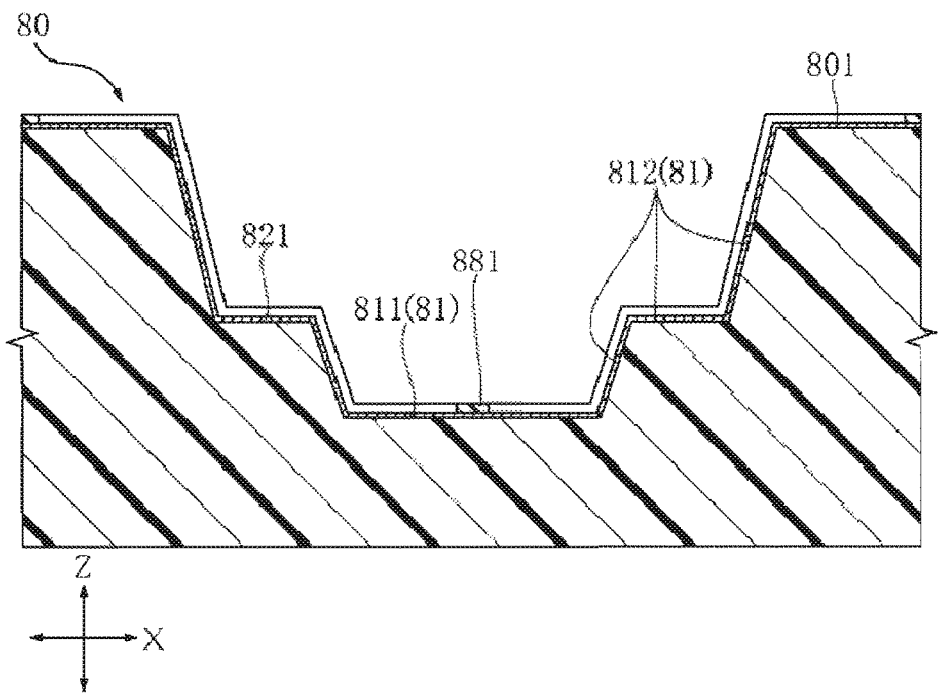
FIG. 32 is a cross-sectional view illustrating a step of making the semiconductor device shown in FIG. 24.

Then, a mask for forming a plating layer 822 is formed on the base layer 821 by photolithography. As shown in FIG. 32, after a first mask layer 881 is formed on the base material 80 by covering the base layer 821, the first mask layer 881 is exposed and developed, thereby forming the mask on the base layer 821. The configuration and formation method of the first mask layer 881 are the same as those of the first mask layer 881 when making the semiconductor device A10. A portion of the first mask layer 881 is removed by exposure to expose the base layer 821.

Figure 33:
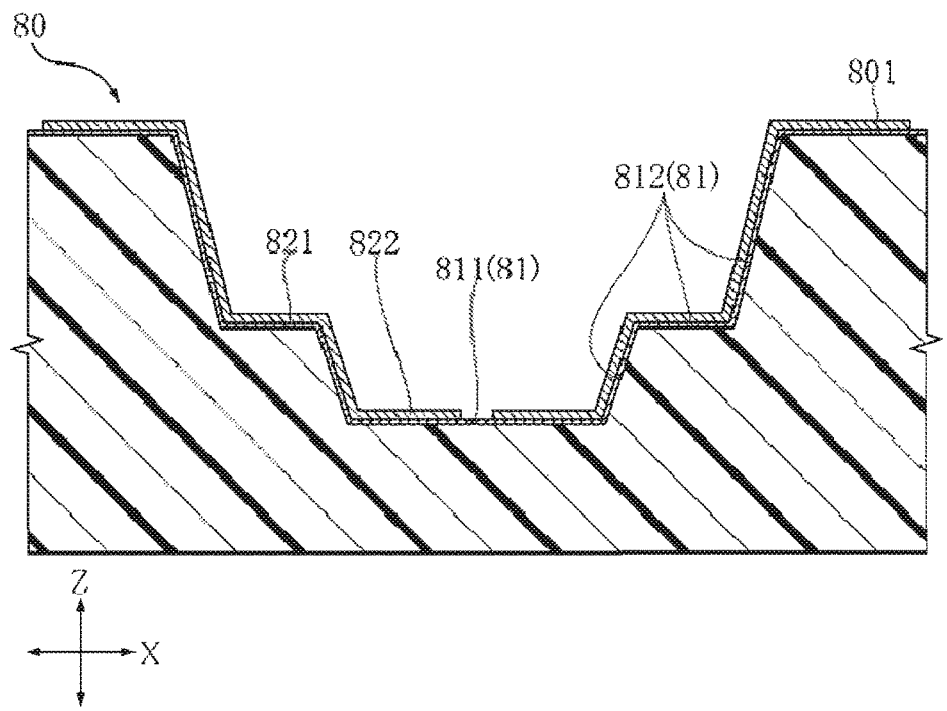
FIG. 33 is a cross-sectional view illustrating a step of making the semiconductor device shown in FIG. 24.

Then, as shown in FIG. 33, the plating layer 822 is formed to be in contact with the base layer 821 exposed from the first mask layer 881. The configuration and the formation method of the plating layer 822 are the same as those of the plating layer 822 when making the semiconductor device A10. After the plating layer 822 is formed, the first mask layer 881 formed on the base material 80 is entirely removed.

Figure 34:
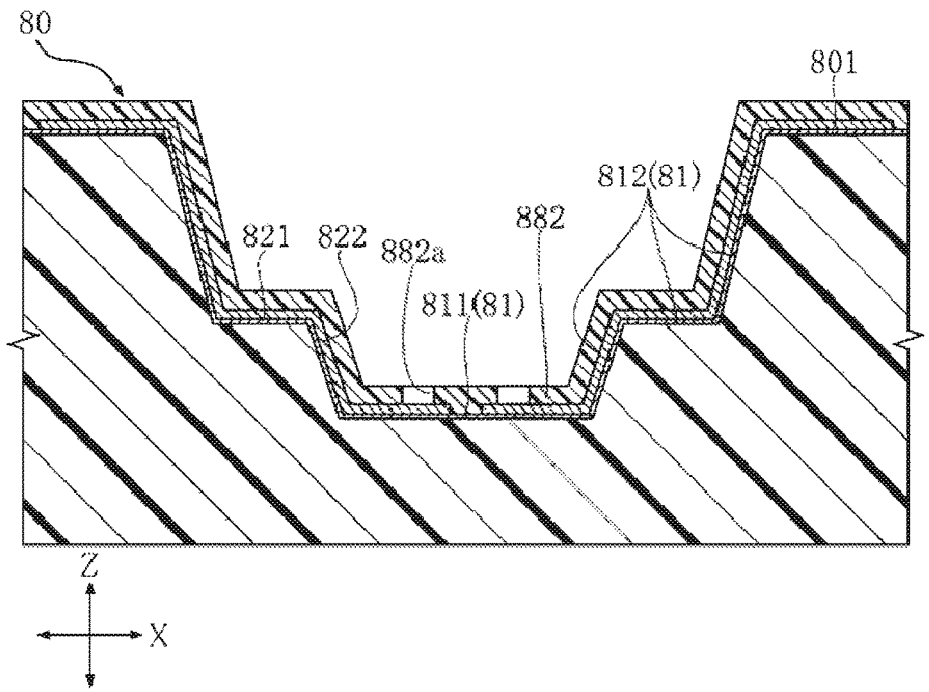
FIG. 34 is a cross-sectional view illustrating a step of making the semiconductor device shown in FIG. 24.

Then, a mask for forming the bonding layer 832 is formed on the base layer 821 and the plating layer 822 by photolithography. As shown in FIG. 34, after the second mask layer 882 is formed on the base material 80 by covering the base layer 821 and the plating layer 822, the second mask layer 882 is exposed and developed, thereby forming the mask on the base layer 821 and the plating layer 822. At this time, an opening 882a is formed on the second mask layer 882 by exposure. In the present embodiment, the opening 882a is formed on the conductive layer 82 in contact with the bottom surface 811 of the groove portion 81. Further, in the present embodiment, the shape of the opening 882a is a rectangular shape (not shown).

Figure 35:
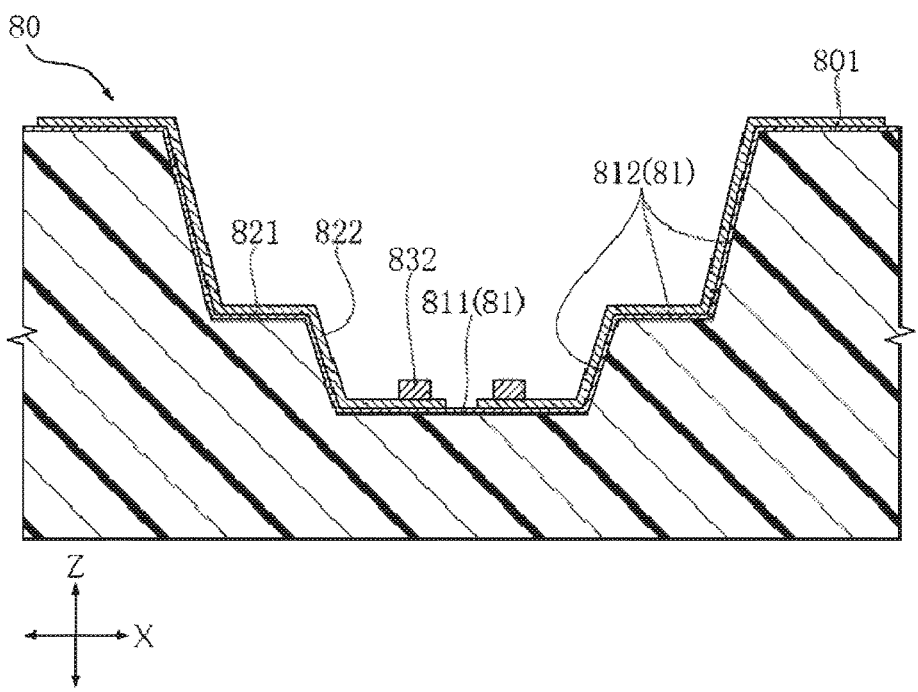
FIG. 35 is a cross-sectional view illustrating a step of making the semiconductor device shown in FIG. 24.

Then, as shown in FIG. 35, the bonding layer 832 is formed to be in contact with the conductive layer 82, which is formed to be in contact with the groove portion 81. In the present embodiment, the bonding layer 832 is formed to be in contact with the conductive layer 82, which is formed with the second mask layer 882 having the opening 882a. The configuration and the formation method of the bonding layer 832 are the same as those of the bonding layer 832 when making the semiconductor device A10. At this time, the bonding layer 832 is formed by filling the opening 882a of the second mask layer 882. After forming the bonding layer 832, the third mask layer 883 formed on the base material 80 is entirely removed.

Figure 36:
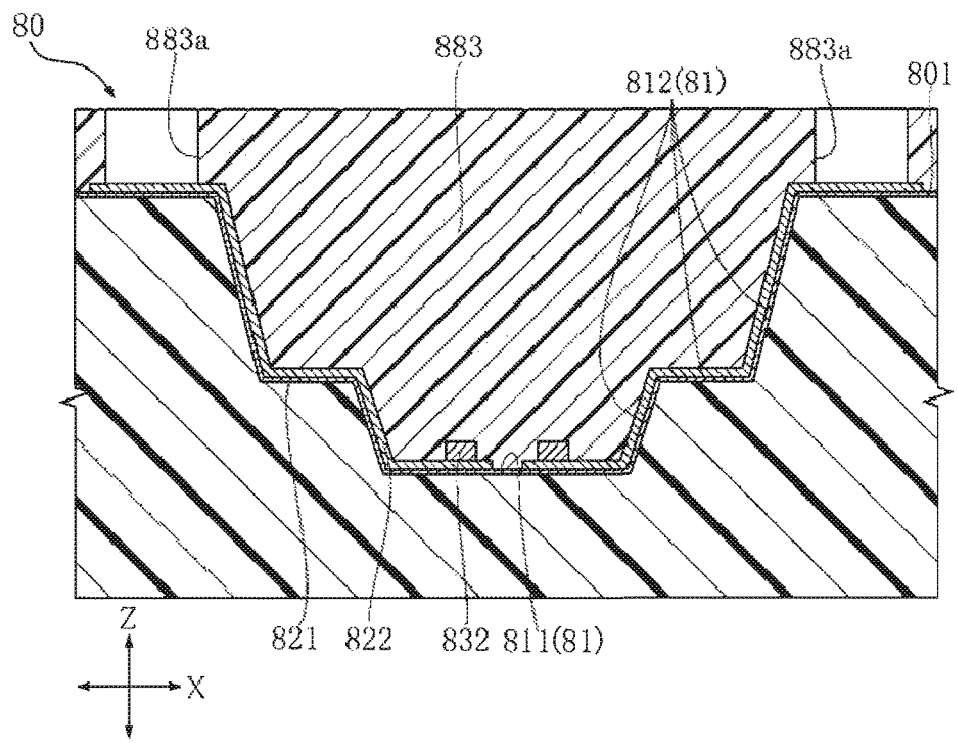
FIG. 36 is a cross-sectional view illustrating a step of making the semiconductor device shown in FIG. 24.

Then, a mask for forming the conductive pillar 823 is formed on the base layer 821 and the plating layer 822 by photolithography. As shown in FIG. 36, after the third mask layer 883 is formed on the base material 80 by covering the base layer 821 and the plating layer 822, the third mask layer 883 is exposed and developed, thereby forming the mask on the base layer 821 and the plating layer 822. At this time, an opening 883a is formed on the third mask layer 883 by exposure. In the present embodiment, the opening 883a is formed on the conductive layer 82, which is formed to be in contact with the main surface 801 of the base material 80. Further, in the present embodiment, the shape of the opening 883a is a cylindrical shape (not shown).

Figure 37:
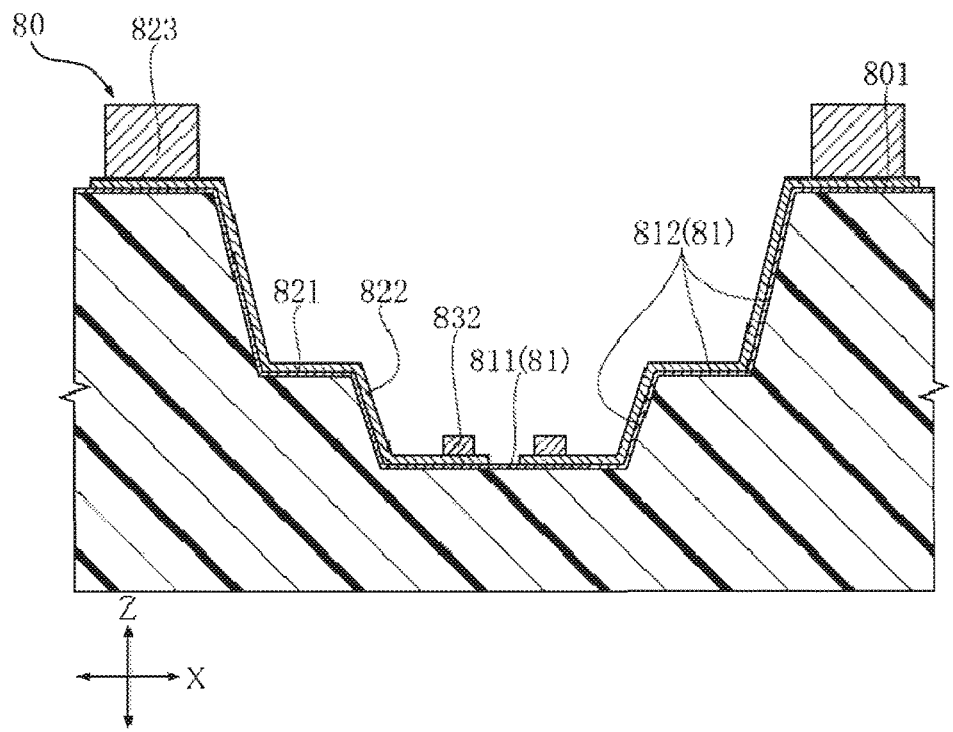
FIG. 37 is a cross-sectional view illustrating a step of making the semiconductor device shown in FIG. 24.
Figure 38:
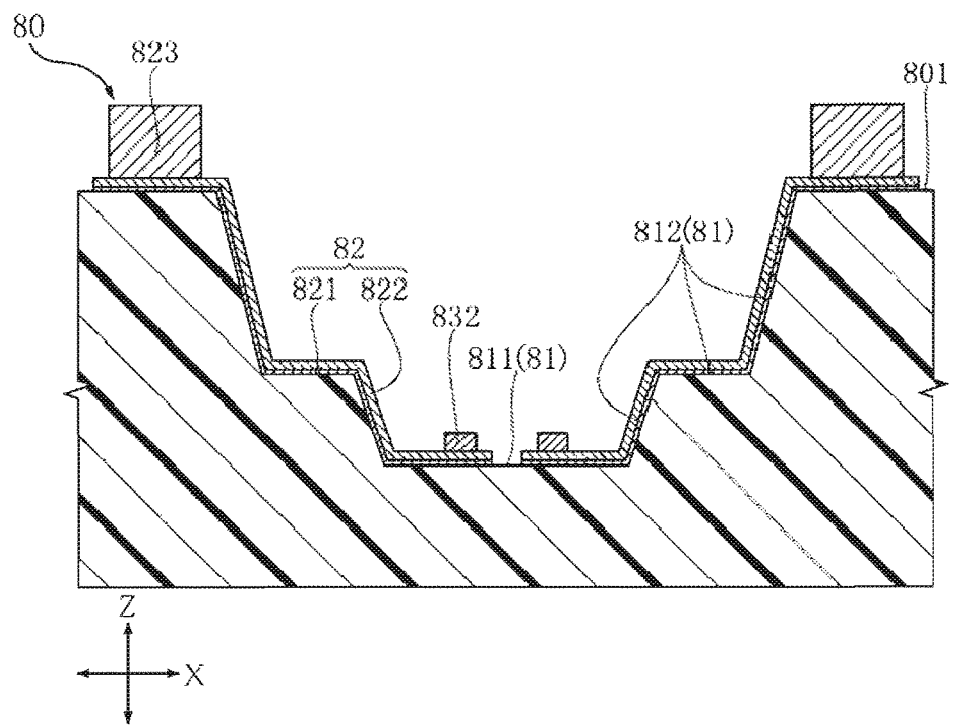
FIG. 38 is a cross-sectional view illustrating a step of making the semiconductor device shown in FIG. 24.

Then, as shown in FIG. 37, the conductive pillar 823 is formed to be in contact with the conductive layer 82, which is in contact with the main surface 801 of the base material 80, and protrudes to a side opposite to the bottom surface 811 of the groove 81 with respect to the main surface 801. In the present embodiment, the conductive pillar 823 includes Cu, and is formed by electrolytic plating and using the base layer 821 and the plating layer 822 as the conductive path. At this time, the conductive pillar 823 is formed by filling the opening 883a of the third mask layer 883. As shown in FIG. 38, after forming the conductive pillar 823, the excess of the base layer 821, which is formed on the third mask layer 833 of the base material 80, and formed on the base material 80 but not covered by the plating layer 822, is completely removed. The method for removing the base layer 821 is the same as that for the base layer 821 when making the semiconductor device A10. The conductive layer 82, the conductive pillar 823 and the bonding layer 832 are formed by the above steps.

Figure 39:
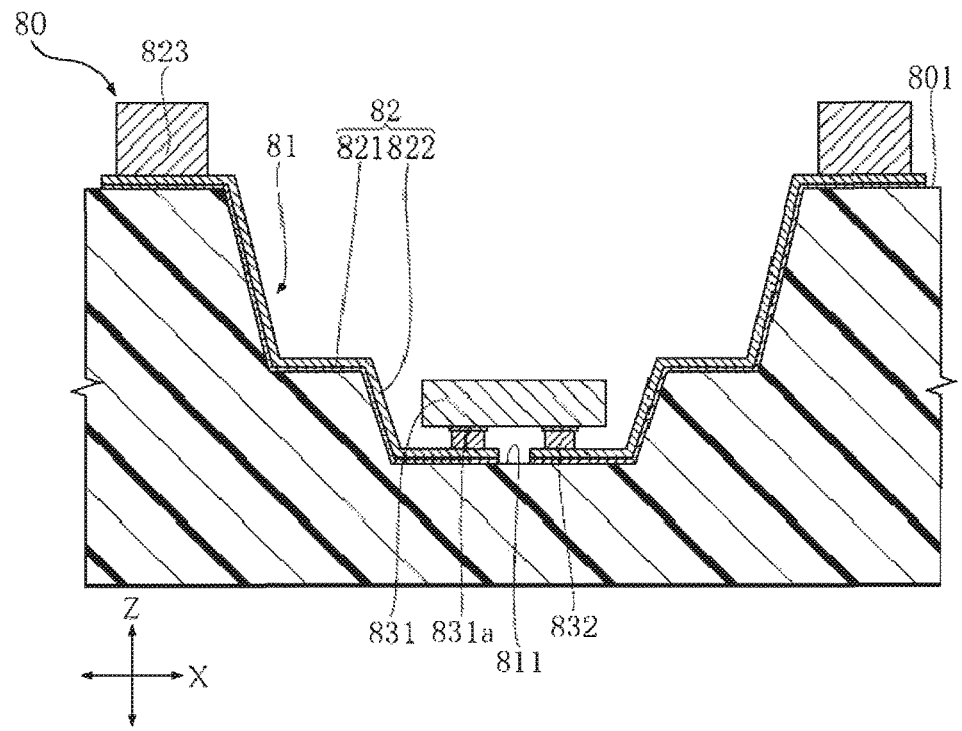
FIG. 39 is a cross-sectional view illustrating a step of making the semiconductor device shown in FIG. 24.

Then, as shown in FIG. 39, a semiconductor element 831 is mounted on the bottom surface 811 of the groove portion 81 so as to be disposed in the groove portion 81. The method for mounting the semiconductor element 831 and the method for mounting the semiconductor element 31 when making the semiconductor device A10 are both FCB.

Figure 40:
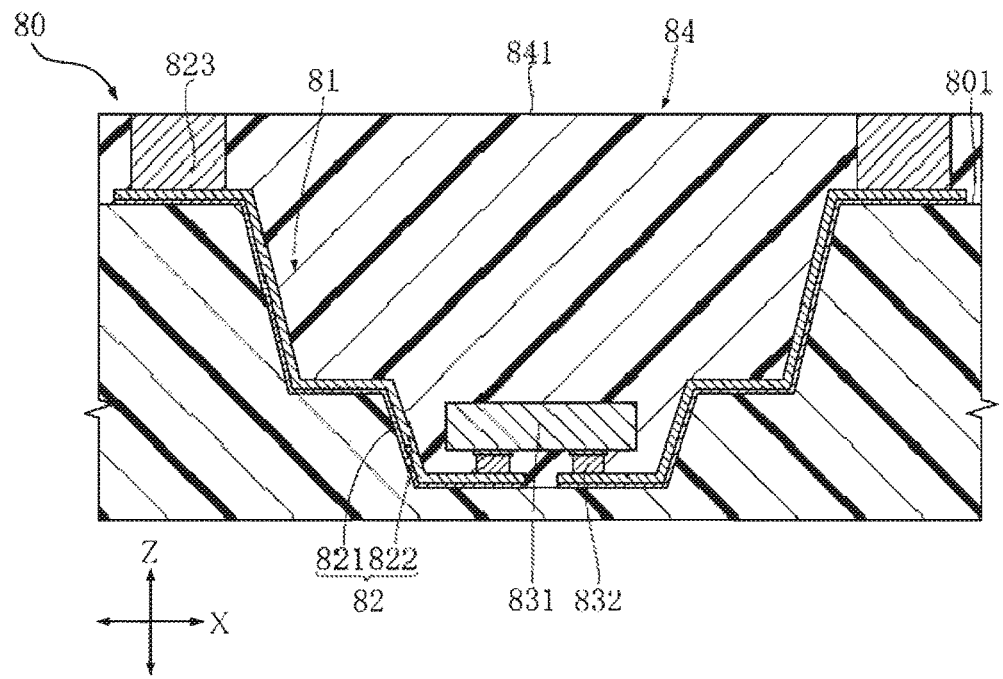
FIG. 40 is a cross-sectional view illustrating a step of making the semiconductor device shown in FIG. 24.

Then, as shown in FIG. 40, a sealing resin 84 is formed to cover the semiconductor element 831 and to be filled in the groove portion 81. In the present embodiment, the conductive layer 82 and the conductive pillar 823 are also covered by the sealing resin 84. The configuration of the sealing resin 84 is the same as that of the sealing resin 84 when making the semiconductor device A10. The sealing resin 84 is formed by exposing the conductive pillar 823 from the resin main surface 841. At the same time, a portion of the base material 80 opposite to the main surface 801 in the thickness direction Z of the base material 80 is removed. The removal is performed by, for example, mechanical grinding.

Figure 41:
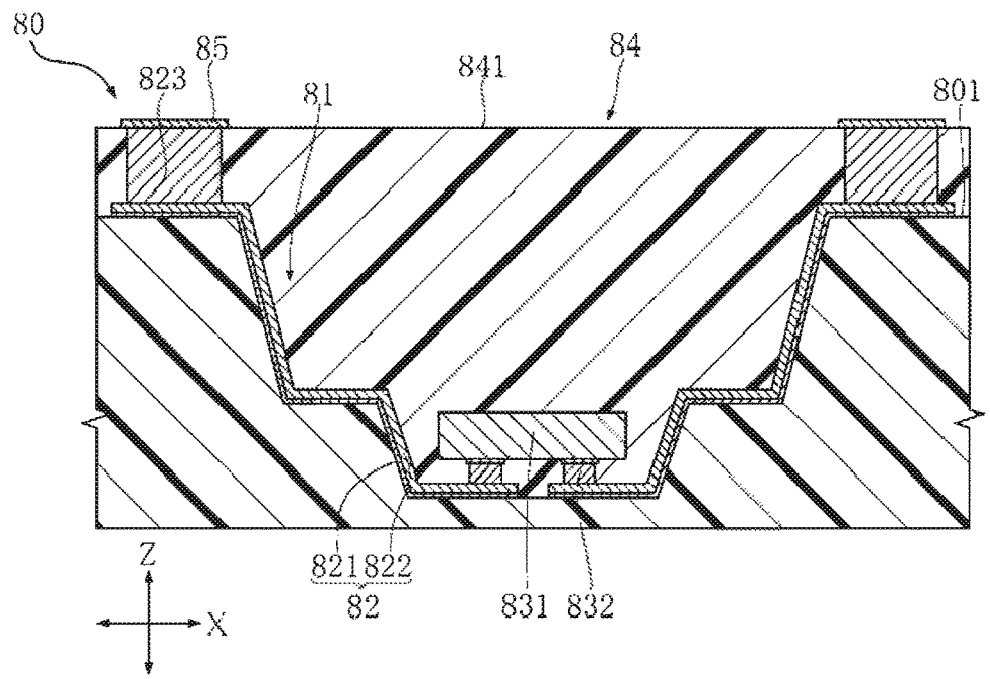
FIG. 41 is a cross-sectional view illustrating a step of making the semiconductor device shown in FIG. 24.
Figure 42:
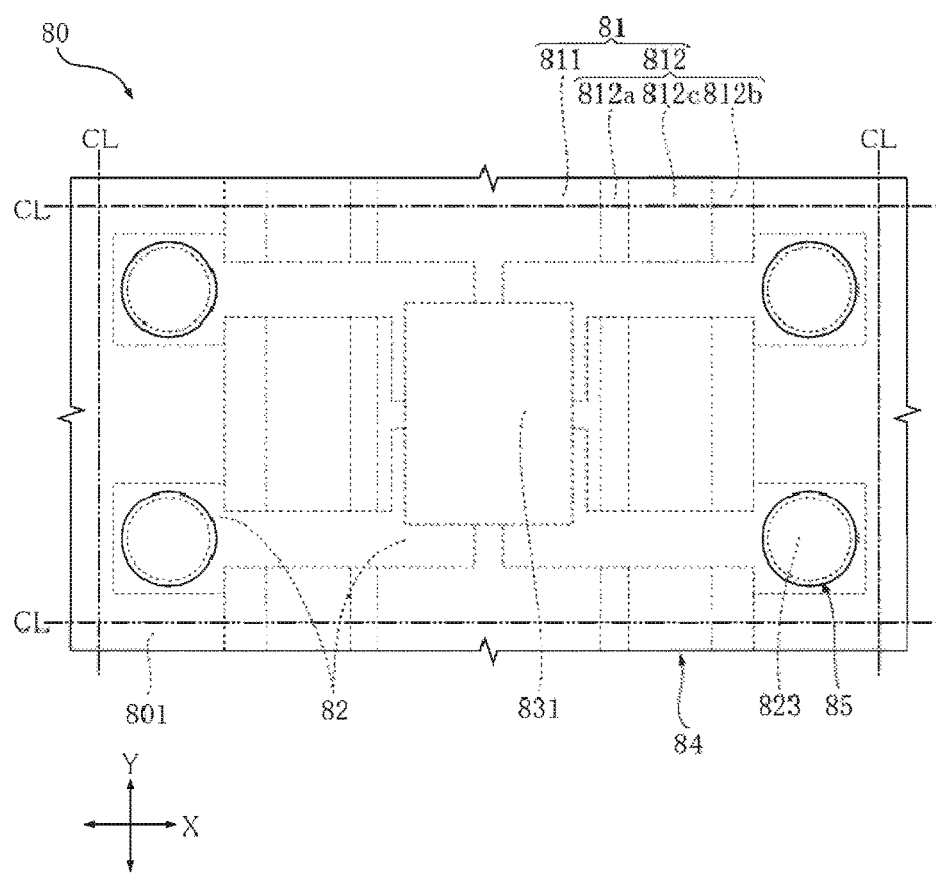
FIG. 42 is a top view illustrating a step of making the semiconductor device shown in FIG. 24.

Then, as shown in FIG. 41, a pad 85 is formed to be in contact with a portion of the conductive pillar 823 which is exposed from the base material 80. The configuration and formation method of the pad 85 are the same as those of the pad 85 when making the semiconductor device A10.

Then, the base material 80 and the sealing resin 84 are cut along the first direction X, and the base material 80 is cut along the second direction Y, thereby dividing into a single slice of each range corresponding to the substrate 1 of the semiconductor device A20. When the cutting is performed, the base material 80 and the sealing resin 84 are cut along the cutting line CL shown in FIG. 42 by, for example, plasma cutting. The single slice formed by dividing in this step becomes the semiconductor device A20. The semiconductor device A20 is made by the above steps.

Then, the effects of the semiconductor device A20 and a method of making the same are illustrated.

Similar to the semiconductor device A10, the semiconductor device A20 includes the substrate 1. The substrate 1 includes an electrical insulative synthetic resin and is formed with the recess 14 recessed from the main surface 11 and the recess 14 has a semiconductor element 31 disposed therein. The recess 14 has the bottom surface 141 and the connecting surface 142. The connecting surface 142 includes a first inclined surface 142a, a second inclined surface 142b and an intermediate surface 142c. Therefore, during the process of making the semiconductor device A20, warpages due to the difference of temperature strains are suppressed.

In the present embodiment, the conductive pillar 291 has one end connected to the main surface wiring portion 23 of the wiring portion 20, another end connected to the pad 292, and a side surface covered by the sealing resin 4. Therefore, a portion of the sealing resin 4 protrudes from the main surface 11 in the thickness direction Z of the substrate 1. Further, the semiconductor element 31 of the present embodiment is a Hall element. On the lower surface of the semiconductor element 31 shown in FIG. 25 and FIG. 26, a magnetic induction surface is provided. By using this configuration, the distance between the magnet disposed outside the semiconductor device A20 and the magnetic induction surface can be set relatively short, so that the sensitivity of the semiconductor element 31 to the variation of the magnetic flux density can be improved.

By the connecting surface 142 including the first inclined surface 142a, the second inclined surface 142b and the intermediate surface 142c, the time required for forming the mold 86 by isotropic etching can be shortened in the formation of the base material 80 during the process of making the semiconductor device A20. Further, by this kind of connecting surface 142, the length (depth) of the recess 14 in the thickness direction Z of the substrate 1 can be ensured to be longer, such that the distance between the magnet disposed outside the semiconductor device A20 and the magnetic induction surface of the semiconductor element 31 can be set shorter.

The semiconductor device of the present invention is not limited to the above-described embodiments. The specific configuration of the respective parts of the semiconductor device of the present invention can be changed according to various designs.

What is claimed is:

1. A semiconductor device, comprising:
   a substrate having a main surface and a back surface facing opposite to the main surface, and having a recess recessed from the main surface;
   a semiconductor element disposed in the recess, wherein the semiconductor element is disposed on a bottom surface of the recess;
   a wiring portion in contact with the substrate and electrically connected to the semiconductor element, wherein the wiring portion contacts with the bottom surface of the recess; and
   a sealing resin covering the semiconductor element and filled in the recess;
   wherein the substrate comprises an electrical insulative synthetic resin;
   the recess has a connecting surface connected to the bottom surface and the main surface; and
   the connecting surface comprises a first inclined surface having one end connected to the bottom surface and inclined with respect to the bottom surface, a second inclined surface having one end connected to the main surface and inclined with respect to the main surface, and an intermediate surface connected to another end of the first inclined surface and another end of the second inclined surface.

2. The semiconductor device of claim 1, wherein the synthetic resin is an epoxy resin containing a filler.

3. The semiconductor device of claim 2, wherein the filler comprises $SiO_2$.

4. The semiconductor device of claim 1, wherein the bottom surface of the recess in a top view is rectangular.

5. The semiconductor device of claim 4, wherein the connecting surface of the recess comprises a pair of surfaces spaced apart from each other along a first direction perpendicular to the thickness direction of the substrate; the recess has a pair of openings spaced apart from each other along a second direction perpendicular to both the thickness direction of the substrate and the first direction; and the sealing resin is exposed from each of the openings.

6. The semiconductor device of claim 1, wherein the wiring portion comprises a base layer and a plating layer laminated to each other, and the base layer is in contact with the substrate.

7. The semiconductor device of claim 6, wherein a thickness of the plating layer is larger than a thickness of the base layer.

8. The semiconductor device of claim 6, wherein the base layer comprises a Ti layer and a Cu layer laminated to each other.

9. The semiconductor device of claim 8, wherein the plating layer comprises Cu.

10. The semiconductor device of claim 1, wherein the wiring portion comprises a bottom surface wiring portion in contact with the bottom surface of the recess, and a connecting surface wiring portion in contact with the connecting surface of the recess, and the semiconductor element is connected to the bottom surface wiring portion.

11. The semiconductor device of claim 10, further comprising a terminal portion configured as an external electrical connection for the wiring portion, wherein the terminal portion has a pillar with one end in contact with the wiring portion and a pad in contact with the other end of the pillar.

12. The semiconductor device of claim 11, wherein the pillar comprises Cu.

13. The semiconductor device of claim 11, wherein the pad comprises a Ni layer, a Pd layer and an Au layer laminated to each other.

14. The semiconductor device of claim 11, wherein the pillar is inside the substrate and exposed from the bottom surface of the recess and the back surface; one end of the pillar exposed from the bottom surface is in contact with the bottom surface wiring portion; and the other end of the pillar exposed from the back surface is in contact with the pad.

15. The semiconductor device of claim 14, further comprising an inductor on the intermediate surface of the connecting surface of the recess.

16. The semiconductor device of claim 11, wherein the wiring portion comprises a main surface wiring portion in contact with the main surface; one end of the pillar is in contact with the main surface wiring portion; the other end of the pillar is in contact with the pad; and a side surface of the pillar is covered by the sealing resin.

17. The semiconductor device of claim 16, wherein the semiconductor element is a Hall element.

18. The semiconductor device of claim 10, further comprising a bonding layer between the semiconductor element and the bottom surface wiring portion.

19. The semiconductor device of claim 18, wherein the bonding layer comprises a Ni layer and an alloy layer containing Sn, the Ni layer and the alloy layer laminated to each other.

20. The semiconductor device of claim 1, wherein the sealing resin comprises the same material as the substrate.

21. The semiconductor device of claim 1, wherein the wiring portion is electrically connected to a back surface of the semiconductor element, the back surface of the semiconductor element faces the substrate.

22. The semiconductor device of claim 1, wherein the sealing resin has a side surface coplanar with an outer surface of the substrate facing away from the semiconductor element.

* * * * *